United States Patent [19]

Imamura et al.

[11] Patent Number: 5,535,170
[45] Date of Patent: Jul. 9, 1996

[54] SEQUENTIAL ACCESS MEMORY THAT CAN HAVE CIRCUIT AREA REDUCED

[75] Inventors: Yukinaga Imamura; Kazuya Yamanaka; Shiro Hosotani; Minobu Yazawa, all of Hyogo, Japan

[73] Assignees: Mitsubishi Denki Kabushiki Kaisha; Mitsubishi Electric Engineering Co., Ltd., both of Tokyo, Japan

[21] Appl. No.: 439,558

[22] Filed: May 11, 1995

[30] Foreign Application Priority Data

May 27, 1994 [JP] Japan .................................... 6-115371

[51] Int. Cl.⁶ .............................. G11C 8/00; G11C 7/00
[52] U.S. Cl. ..................... 365/239; 365/240; 365/189.05; 365/189.12; 365/220; 365/221; 365/230.08
[58] Field of Search ..................................... 365/239, 240, 365/189.05, 189.12, 220, 221, 230.08

[56] References Cited

U.S. PATENT DOCUMENTS

| 4,961,169 | 10/1990 | Matsumura et al. | 365/189.12 |
| 5,444,660 | 8/1995 | Yamanaka et al. | 365/239 |
| 5,448,530 | 9/1995 | Masuda et al. | 365/239 |

FOREIGN PATENT DOCUMENTS

| 63-175953 | 7/1988 | Japan . |
| 1-260696 | 10/1989 | Japan . |
| 3-263686 | 11/1991 | Japan . |
| 4-289588 | 10/1992 | Japan . |
| 4-305889 | 10/1992 | Japan . |
| 5-198163 | 8/1993 | Japan . |

*Primary Examiner*—David C. Nelms
*Assistant Examiner*—Trong Phan
*Attorney, Agent, or Firm*—Lowe, Price, LeBlanc & Becker

[57] ABSTRACT y memory blocks are connected in series. A row select signal is output to each memory block from a row address pointer corresponding to a plurality of memory circuits in one memory block. Similarly, a column select signal is output to each memory block from a column address pointer corresponding to a plurality of memory circuits in one memory block. Therefore, the same row and column select signals are applied to each memory block, whereby data is sequentially input/output for every memory block. Thus, the circuit complexity of the row and column address pointers can be reduced.

29 Claims, 22 Drawing Sheets

SEQUENTIAL ACCESS MEMORY THAT CAN HAVE CIRCUIT AREA REDUCED

BACKGROUND OF THE INVENTION

1. Field of the Invention

The present invention relates to sequential access memories, and more particularly, to a sequential access memory including an address pointer for providing a row or column select signal to access an internal memory cell.

2. Description of the Background Art

Signal processing techniques, particularly techniques of image and video signal processing widely used in TV receivers, facsimile devices, and copiers have become important these recent years. The trend of this signal processing is towards digital technology superior in accuracy and reliability from the conventional analog technology according to progress in the semiconductor technology. This field has evolved tremendously these few years.

In signal processing using digital technology, a semiconductor memory is required that temporarily stores a signal which is to be delayed. For data representing one image or picture, data corresponding to each pixel forming that picture is sequentially transferred to be processed from one corner of the screen. A sequential access memory (referred to as SAM hereinafter) is generally used as a semiconductor memory employed for delaying data.

A conventional SAM will be described hereinafter with reference to FIG. 30 showing the main components thereof.

Referring to FIG. 30, a memory access array MA includes a plurality of memory circuits MC arranged in n rows and m columns. Each memory circuit MC holds k bits of data. A plurality of row select lines Qr1–Qrn are provided corresponding to the plurality of rows in memory cell array MA. Also, a plurality of column select lines Qc1–Qcm are provided corresponding to the plurality of columns in memory cell array MA.

A row address pointer RA applies sequential row select signals Qr1–Qrn (in the following, signal lines and signals transmitted to that signal line are denoted with the same reference character) are provided to the plurality of row select lines Qr1–Qrn to sequentially select one row out of memory cell array MA. Row address pointer RA includes a plurality of registers R for sequentially shifting data (row select signal) in synchronization with an input clock signal, and an even number of NOT logic circuits IR for feeding back an output signal of register R of the last stage to register R of the first stage. NOT logic circuit IR serves as a buffer for driving the wiring capacity.

Column address pointer CA provides sequential column select signals Qc1–Qcm to the plurality of column select lines Qc1–Qcm to sequentially select one row from memory cell array MA. Similar to row address pointer RA, column address pointer CA includes a plurality of registers R for sequentially shifting data (column select signal) in synchronization with an input clock signal, and an even number of NOT logic circuits IC for feeding back an output signal of register R of the last stage to register R of the first stage. NOT logic circuit IC serves as a buffer for driving the wiring capacity.

The operation of an SAM having the above structure will be described hereinafter with reference to the timing chart of FIG. 31.

Referring to FIG. 31, in the first cycle, the plurality of registers R in row address pointer RA respond to a clock signal to sequentially shift data of an H level (logical high). As a result, row select signals Qr1–Qrn sequentially attain an H level, whereby m rows in memory cell array MA are sequentially selected. In the first cycle, column select signal Qc1 is maintained at an H level by column address pointer CA. As a result, memory circuit MC of the first row of the first column, memory circuit MC of the second row of the first column, ..., memory circuit MC of the n-th row of the first column are sequentially selected. Data is written into or read out from the selected memory circuit.

The data of an H level held in register R of the last stage in row address pointer RA is shifted to register R of the first stage via NOT logic circuit IR. Therefore, at the second cycle, the plurality of registers R in row address pointer RA respond to a clock signal to sequentially shift the data of an H level, whereby row select signals Qr1–Qrn are sequentially rendered to an H level. In the second cycle, column select signal Qc2 is held at an H level by column address pointer CA. Therefore, the second column of memory cell array MA is selected. As a result, memory circuit MC of the first row of the second column, memory circuit MC of the second row of the second column, ..., memory circuit MC of the n-th row of the second column are sequentially selected.

Similarly, at the m-th cycle, memory circuit MC of the first row of the m-th column, memory circuit MC of the second row of the n-th column, ..., memory circuit MC of the m-th row of the m-th column are sequentially selected. Data of an H level held in register R of the last stage in column address pointer CA is shifted to register R of the first stage via NOT logic circuit IC. As a result, following the selection of memory circuit MC of the n-th row of the m-th column in memory array MA, memory circuit MC of the first row of the first column is selected. Then, the first to m-th cycles are sequentially repeated.

An example of a register in the row and column address pointers shown in FIG. 30 will be described hereinafter with reference to the circuit diagram of FIG. 32.

Referring to FIG. 32, a register includes p channel MOS transistors Q101–Q104, n channel MOS transistors Q105–Q108, and NOT logic circuits G201–G204. Transistors Q101 and Q105 form a CMOS transmission gate. Similarly, transistors Q102–Q104 and corresponding transistors Q106–Q108 respectively form a CMOS transmission gate. A clock signal CLKA is provided to transistors Q105, Q102, Q103, and Q108. A clock signal CLKB is applied to transistors Q101, Q106, Q107, and Q104. FIG. 33 is a timing chart showing a clock signal provided to the register of FIG. 32. As shown in FIG. 33, clock signals CLKA and CLKB form a two layered clock wherein the period of the H levels do not overlap each other.

Transistors Q101 and Q105 receive a signal Xj output from the register of a preceding stage. A signal Xj+1 which is to be provided to the register of the next stage is output from a node (N3) of NOT logic circuit G204 and transistors Q104 and Q108. Signal Xj+1 is provided to memory cell array MA as a row or column select signal Q.

When clock signal CLKA attains an L level (logical low) and clock signal CLKB attains an H level, transistors Q102 and Q106, and transistors Q103 and Q107 are turned on, and transistors Q101 and Q105, and transistors Q104 and Q108 are turned off. Therefore, the signal applied to node N2 is latched by a latch circuit formed of NOT logic circuits G201, G202 and transistors Q102, Q106, and also output to node N3 as signal Xj+1 via transistors Q103, Q107 and NOT logic circuits G203, G204.

When clock signal CLKA attains an H level and clock signal CLKB attains an L level, transistors Q101, Q105, and transistors Q104, Q108 are turned on, and transistors Q103, Q107, and transistors Q102, Q106 are turned off. Therefore, signal Xj applied to node N1 is provided to node N2 via transistors Q101, Q105 and NOT logic circuits G201, G202. Also, signal Xj+1 of node N3 is latched by a latch circuit formed of NOT logic circuits G203, G204 and transistors Q104 and Q108. As a result, signal Xj applied to node N1 is shifted to node N3 in response to clock signals CLKA and CLKB.

In FIG. 33, it is assumed that the time period in which clock signal CLKA attains an L level and an H level only once is one period T. As to a clock signal applied to register R forming row address pointer RA, the time period in which each of row select signals Qr1–Qrm attains an H level corresponds to one period T. As to a clock signal applied to register R forming column address pointer CA, the time period in which each of column select signals Qc1–Qcm attains an H level corresponds to one period T. It is to be noted that an operation similar to the above-described operation is carried out even when the operation timing of column address pointer RA and column address pointer CA are interchanged.

The memory circuit shown in FIG. 30 will be described in detail with reference to FIG. 34.

Referring to FIG. 34, a memory circuit includes a write bit line WBL, a read bit line RBL, write and read word lines RWWL1–RWWL3, n channel MOS transistors Q111–Q117, and capacitors C111, C112.

Transistor Q111 is connected to write bit line WBL. Transistor Q111 has its gate connected to word line RWWL2. C111 is connected to transistor Q111 and a ground potential. Transistor Q112 has its gate connected to capacitor C111 and transistor Q111. Transistor Q112 is connected to ground potential and transistor Q113. Transistor Q113 is connected to read bit line RBL. Transistor Q113 has its gate connected to word line RWWL1. Read bit line RBL is connected to a predetermined precharge voltage $V_p$ via transistor Q117. Transistor Q117 has its gate supplied with a predetermined precharge signal PC.

According to the above-described structure, the data transmitted by write bit line WBL is stored in capacitor C112 via transistor Q111, whereby the potential of read bit line RBL is determined according to the charge of capacitor C111. Transistors Q111–Q116 and capacitor C112 are similar to transistors Q111–Q113 and capacitor C111.

The operation of the memory circuit of the above structure will be described hereinafter with reference to the timing chart of FIG. 35.

Referring to FIG. 35, the operation of the memory circuit at a timing L2 where word line WWL2 attains an H level will be described first. At the timing PC1 before word line WWL2 attains an H level, the potential of readout bit line RBL is precharged and maintained at the H level. When word line RWWL2 attains an H level at timing L2, transistors Q111 and Q116 forming the memory circuit are turned on. Here, the potential of write bit line WBL is stored and maintained in storage capacitor C111. When the potential of storage capacitor C112 attains an H level, transistor Q115 is turned on, whereby the potential of readout bit line RBL is pulled down to an L level through transistors Q115 and Q116. Similarly, when the potential of storage capacitor C112 attains an L level, transistor Q115 attains an OFF state, and the potential of readout bit line RBL remains at the H level. Therefore, the data stored in a memory circuit can be read out by sensing the two states with a sense amplifier (not shown).

In a general video signal processing, the SAM uses the memory capacity of one scan line (x words) of a video signal as one unit. When a memory capacity of y units is required, a row address pointer RA and a column address pointer CA corresponding to N rows and M columns as described above were used to allocate the memory cells of the capacity of y units into N rows and M columns to sequentially select the N rows and M columns similar to the case of an SAM of one unit. This means that the circuit complexity of the address pointer is increased as the memory capacity becomes greater, resulting in increase in the chip area and power consumption of the SAM.

SUMMARY OF THE INVENTION

An object of the present invention is to provide an SAM of a small area and low power consumption.

Another object of the present invention is to provide an SAM that can have the circuit complexity of an address pointer reduced.

A sequential access memory according to an aspect of the present invention that stores y units of a data train that has x words as one unit, includes y memory cell arrays connected in series, each storing data of x words, and an address pointer for providing a plurality of select signals for accessing data of x words sequentially into each of the y memory cell arrays. Each of the y memory cell arrays carries out data input/output for every x words according to a select signal.

According to the above-described structure, data input/output is carried out using an address pointer for sequentially accessing data of x words with respect to y memory cell arrays storing data of x words. Therefore, a memory cell array storing the entire data of x×y words can be controlled by an address pointer for accessing data of x words. Thus, the area of the address pointer and also the power consumption thereof can be reduced.

A sequential access memory according to another aspect of the present invention accesses data sequentially using an address pointer that operates at a predetermined period. The sequential access memory includes a write bit line for transmitting write data, a first storage circuit for storing data transmitted by the write bit line, a second storage circuit for storing data stored in the first storage circuit after one period of the address pointer, and a readout bit line for reading out data stored in the second storage circuit after one period of the address pointer.

According to the above-described structure, data transmitted from the write bit line is stored in the first storage circuit, which is stored in the second storage circuit after one period of the address pointer. The data stored in the second storage circuit is read out by the readout bit line after one period of the address pointer. Therefore, a delay operation of two periods of the address pointer is carried out internally. As a result, the number of delay operations of the address pointer is reduced, so that the number of select signals output from the address pointer can be reduced to a half. Thus, the area and the power consumption of the address pointer can be reduced.

A sequential access memory according to a further aspect of the present invention includes first and second write bit lines for transmitting write data, a first storage circuit for storing data transmitted by the first write bit line, a second storage circuit for storing data transmitted by the second write bit line, and a commonly shared readout bit line for transmitting data stored in the first and second storage circuits.

According to the above-described structure, data stored via two write bit lines can be read out with one readout bit line, so that the number of readout bit lines can be reduced. Therefore, the area and power consumption of the sequential access memory can be reduced.

A sequential access memory according to still another aspect of the present invention sequentially selects a predetermined select line out of a plurality of select lines. The sequential access memory includes a first select circuit for providing a first select signal to select a select line, a select circuit for providing a second select line to select a select line, a third select circuit for providing a third select signal to select a predetermined select line from a plurality of select lines according to the first and second select signals, and a control circuit provided at least in one of the first and second select circuits for controlling the output operation of one of the first and second select circuits in response to an externally applied control signal.

According to the above-described structure, the output operation of one of the first and second select circuits can be controlled by the control circuit, and the output operation of a third select signal for selecting a select line can be controlled. Therefore, the circuit complexity of the control circuit can be reduced. As a result, the area and power consumption of the sequential access memory can be reduced.

A sequential access memory according to a still further aspect of the present invention selects a predetermined select line from a plurality of select lines to select a predetermined memory circuit in response to a select signal. The sequential access memory includes k first latch circuits for latching an input signal in response to a first clock signal, k second latch circuits for latching an output signal of the first latch circuit in response to a second clock signal differing in phase from the first clock signal. The first and second latch circuits are alternately connected in a ring manner. The sequential access memory further includes 2k logic processing circuits for providing as the select signal a logical product of an output signal of the first latch circuit and an output signal of the second latch circuit connected to the first latch circuit.

According to the above-described structure, 2k select signals can be provided with k first latch circuits and k second latch circuits. Therefore, the number of first and second latch circuits can be reduced, resulting in reduction in the circuit area. Thus, the area and the power consumption of the sequential access memory can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
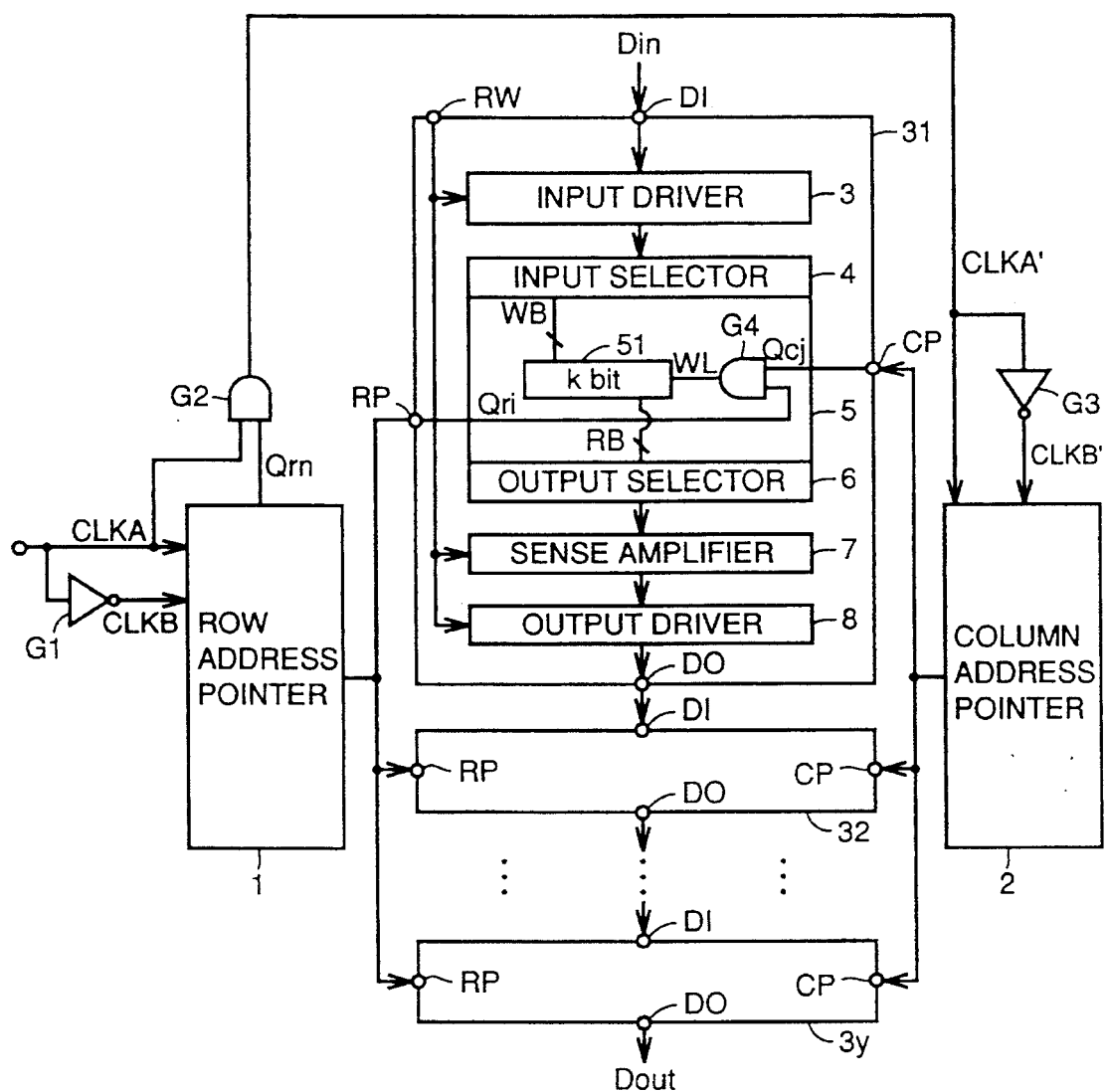
FIG. 1 shows a structure of the main components of a sequential access memory according to an embodiment of the present invention.

An SAM according to an embodiment of the present invention will be described hereinafter. FIG. 1 shows a structure of the main components of an SAM.

Referring to FIG. 1, an SAM includes a row address pointer 1, a column address pointer 2, y memory blocks 31–3y, inverters G1, G3, and an AND gate G2. Memory block 31 includes an input driver 3, an input selector 4, a memory cell array 5, an input selector 6, a sense amplifier 7, and an output driver 8. The remaining memory blocks 32–3y have a structure similar to that of memory block 31.

Memory cell array 5 includes a plurality of memory circuits 51 arranged in n rows and m columns. Each memory circuit 51 holds data of k bits. Corresponding to the n rows of memory cell array 5, n row select lines Qri (i=1~n) are provided. Corresponding to the m columns of memory cell array 5, m column select lines Qcj (j=1~m) are provided. A row select line Qri and a column select line Qcj are respectively connected to AND gate G4. AND gate G4 provides the logical product of row select signal Qri and column select signal Qcj to a word line WL. Here, word line WL is activated, whereby memory circuit 51 attains a selected state.

A control signal RW is applied to input driver 3, sense amplifier 7, and output driver 8 to control the read out and writing operations. A signal Din from an input terminal DI is stored in memory circuit 51 via input driver 3, selector 4, and write bit line WB. The signal stored in memory circuit 51 is read out by sense amplifier 7 via readout bit line WB and output selector 6 at an elapse of a time T which is one period of an address pointer, and output to an output terminal DO via output driver 8. Output terminal DO of memory block 31 is connected to input terminal DI of memory block 32. Thereafter, an output terminal and an input terminal of each memory block are sequentially connected, so that data Din applied from input terminal DI of memory block 31 is output as output signal Dout from output terminal DO of the last stage memory block 3y.

Figure 30:
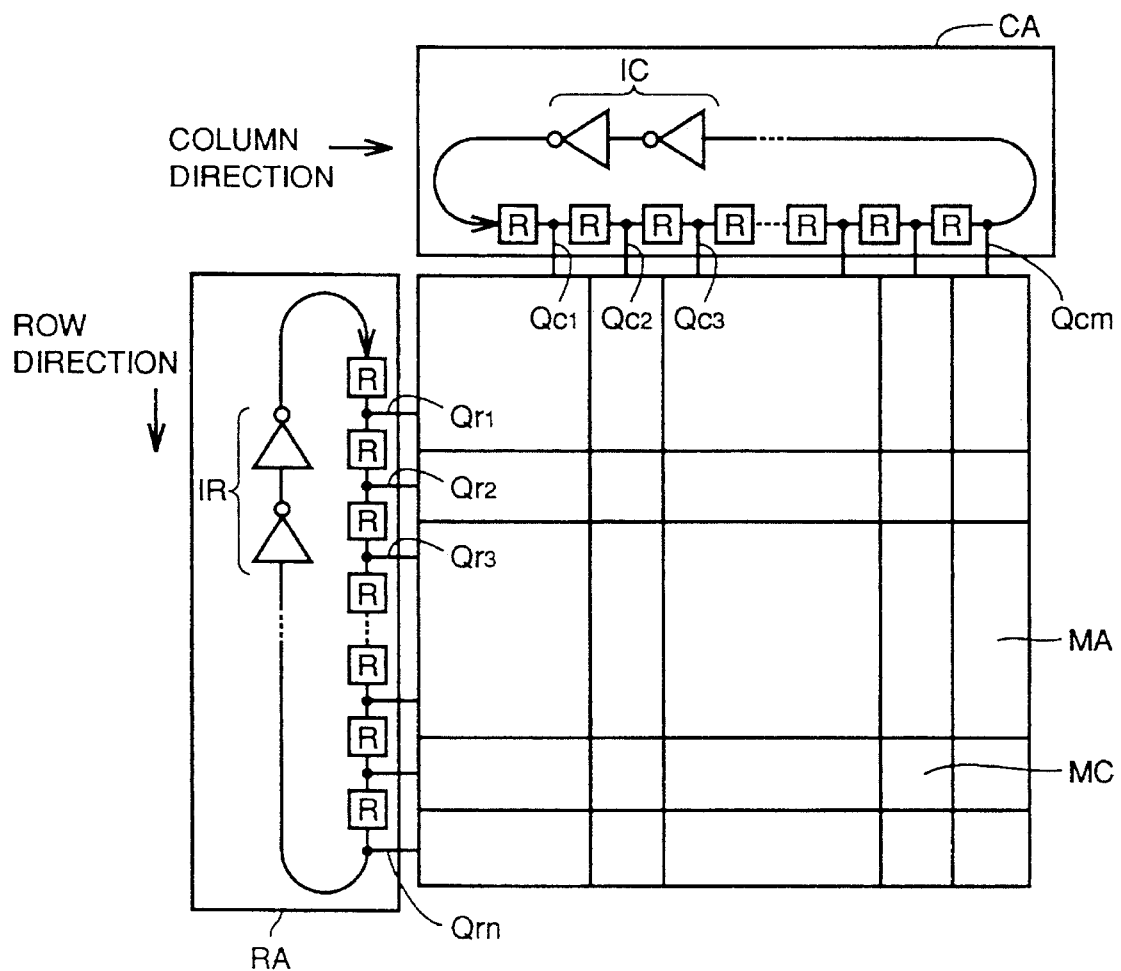
FIG. 30 shows a structure of the main components of a conventional sequential access memory.
Figure 31:
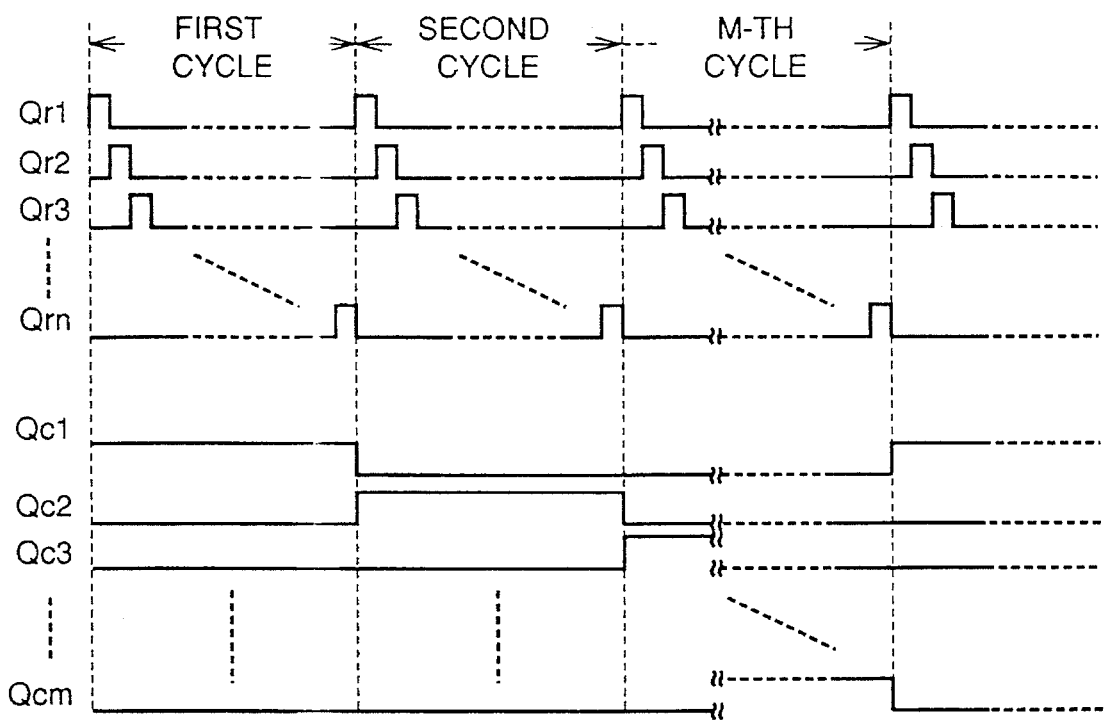
FIG. 31 is a timing chart for describing the timing of row and column select signals provided from the row and column address pointers of FIG. 30.

A predetermined clock signal CLKA and a clock signal CLKB which is clock signal CLKA inverted by inverter G1 are applied to row address pointer 1. Row address pointer 1 has a structure similar to that of the address pointer shown in FIG. 30 including the register of FIG. 32. Row address pointer 1 responds to clock signals CLKA and CLKB for providing a row select signal Qr1 (i=1~n) for sequentially selecting one row of memory cell array 5 into each of memory blocks 31–3y. More specifically, row address pointer 1 provides n row select signals Qri to each of the y memory blocks 31–3y.

Clock signal CLKA and the n-th row select signal Qrn provided from row address pointer 1 are applied to AND gate G2. AND gate G2 provides the logical product of the applied clock signal CLKA and row select signal Qrn to row address pointer 2 and inverter G3 as a clock signal CLKA'. More specifically, one clock signal CLKA' is output for every period of row address pointer 1. Clock signal CLKA' is inverted by inverter G3 to be applied to row address pointer 2 as clock signal CLKB'.

Row address pointer 2 responds to applied clock signals CLKA' and CLKB' for providing m column select signals Qcj (j=1~m) for sequentially selecting one column of memory cell array 5 into each of the y memory blocks 31–3y. Column address pointer 2 has a structure similar to that the address pointer of FIG. 30 including the register of FIG. 32. Column address pointer 2 outputs a row select signal Qcj according to clock signals CLKA' and CLKB'.

The n row select signals Qri provided from row address pointer 1 are applied to n row select signal input terminals RB, and the m column select signals Qcj output from column address pointer 2 is applied to the m column select signal input terminals CB. As a result, each of memory blocks 31–3y responds to input row and column select signals to select a predetermined memory circuit 51 to carry out writing and reading operations.

The operation of an SAM of the above structure will be described in detail hereinafter with reference to the timing chart of FIG. 2.

Figure 2:
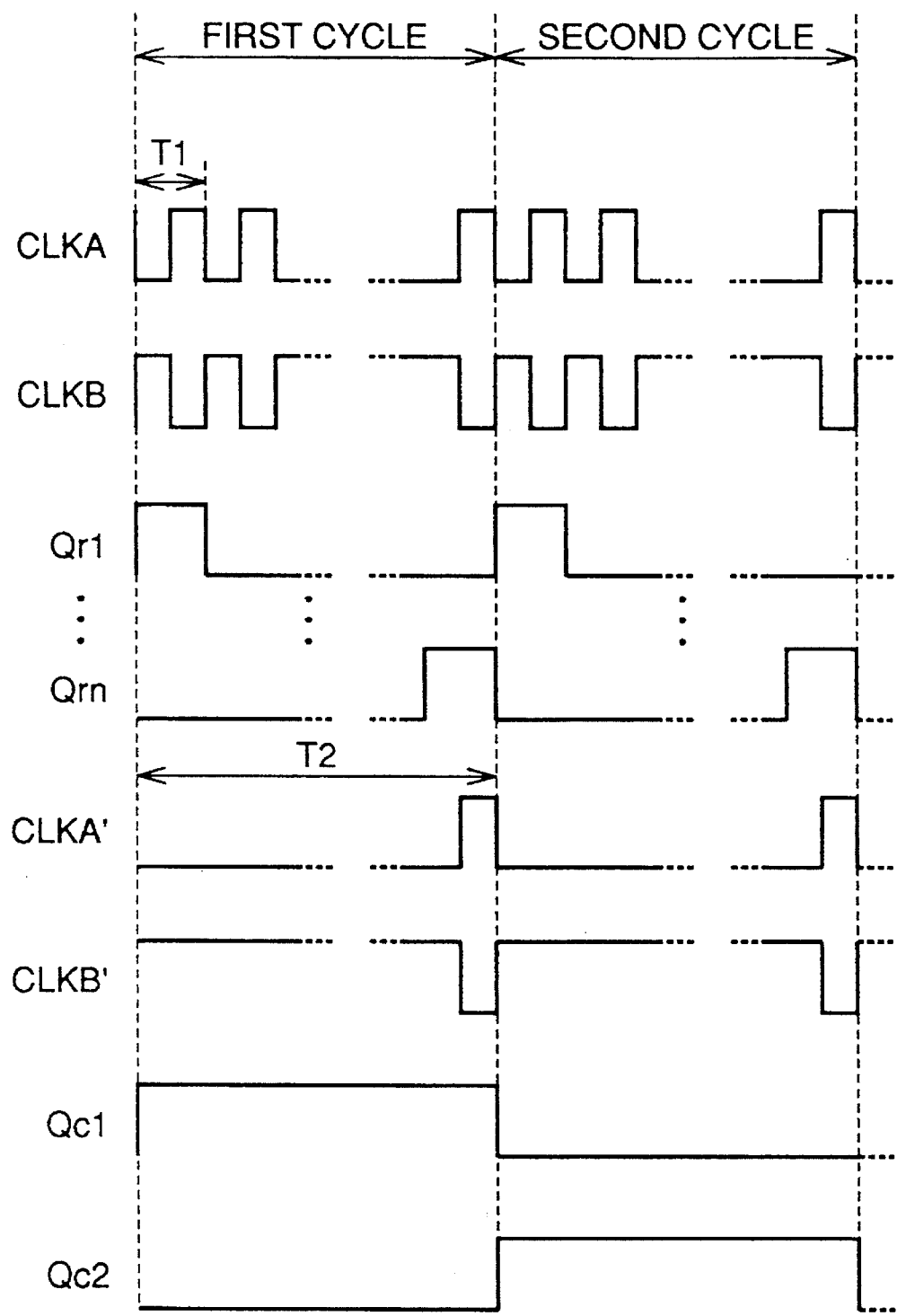
FIG. 2 is a timing chart for describing the operation of the sequential access memory of FIG. 1.

Referring to FIG. 2, at the first cycle, a plurality of registers in row address pointer 1 respond to clock signals CLKA and CLKB to sequentially shift data of an H level. This causes row select signals Qr1–Qrn to attain an H level sequentially, whereby one row of the n rows are sequentially selected in each memory cell array 5 of memory blocks 31–3y. In the first cycle, column select signal Qc1 is maintained at an H level by column address pointer 2. As a result, in each memory array 5 of the y blocks 31–3y, the memory circuit of the first row of the first column, the memory circuit of the second row of the first column, . . . , the memory circuit of the n-th row of the first column are sequentially selected. Data is written into or read out from each selected memory circuit.

At the second cycle, column select signal Qc2 is maintained at an H level by column address pointer 2. As a result, the second column in each memory cell array 5 of the Y memory blocks 31–3y is selected, and the memory circuit of the first row of the second column, the memory circuit of the second row of the second column, . . . , the memory circuit of the n-th row of the second column are sequentially selected. A similar operation is carried out for each cycle. At the m-th cycle, the memory circuit in the first row of the m-th column, the memory circuit of the second row of the m-th column, . . . , the memory circuit of the n-th row of the m-th column are sequentially selected. The first to n-th cycles are sequentially repeated.

With respect to y memory blocks connected in series, n row select signals m column select signals are applied from row address pointer 1 and column address pointer 2, respectively. Data Din applied from data input terminal DI of memory block 31 of the first stage is stored in memory circuit 51 via input driver 3 and input selector 4. The data stored in memory circuit 51 is read out by sense amplifier 7 via output selector 6 at an elapse of a time period T which is one period of the address pointer. This data is provided from data output terminal DO to data input terminal DI of the next stage memory block 32 via output driver 8. Therefore, after the above-described operation is carried out for all the stages of the memory blocks 31–3y, i.e. repeated y times, input data Din is output from output terminal DO of memory block 3y which is the last stage as output data Dout.

As described above, an SAM of the present embodiment can control the operation of a plurality of memory blocks using a row address pointer and a column address pointer corresponding to n rows and m columns, i.e. only one memory block. It is therefore possible to reduce the circuit complexity of the address pointer. More specifically, when y memory blocks are used, the circuit complexity of the row and column address pointers is reduced to 1/y. Therefore, the chip area of an SAM can be reduced, and the power consumption of the address pointer can be lowered. Thus, reduction in the power consumption of the device can be realized.

Figure 3:
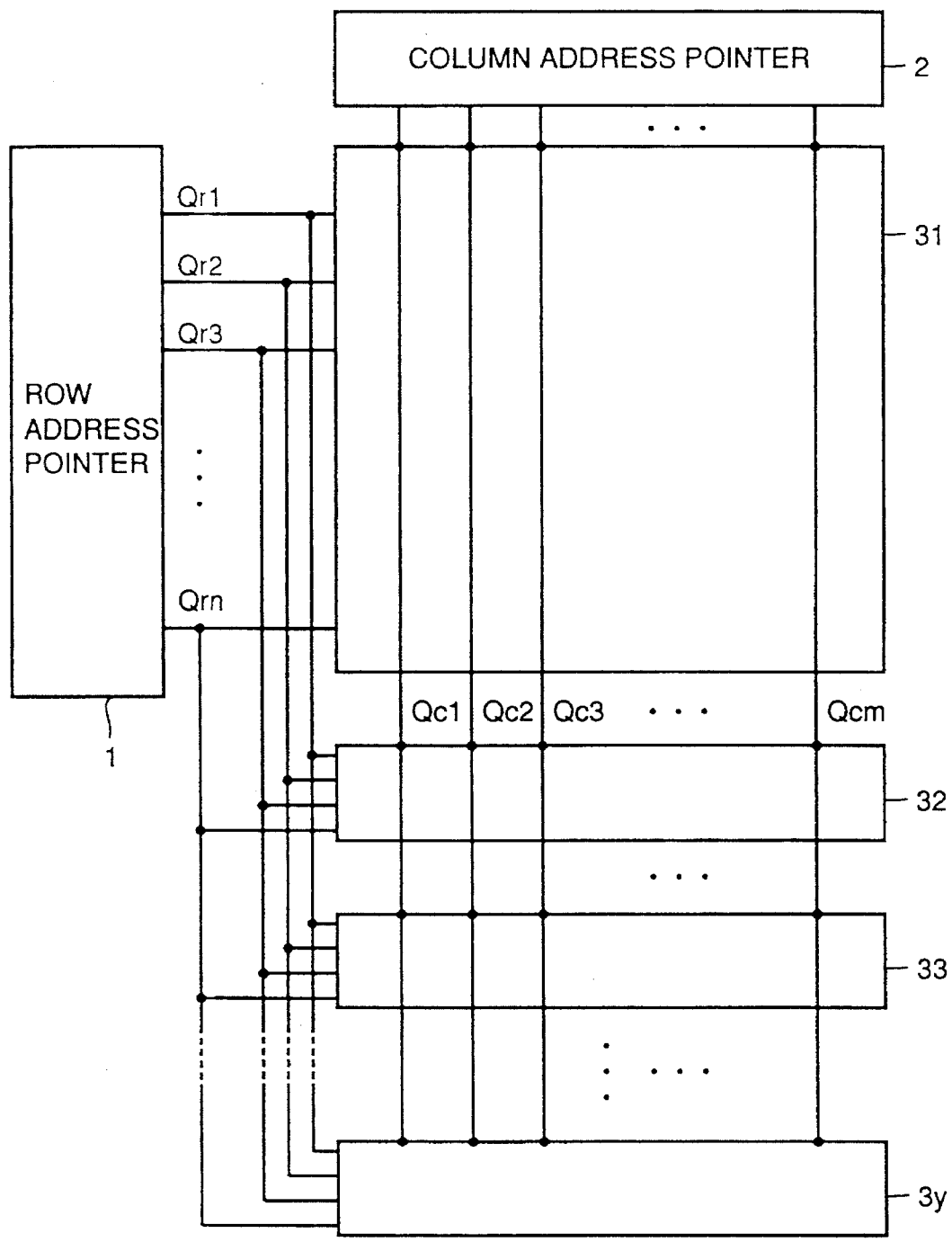
FIG. 3 is a first layout diagram of the main components of the sequential access memory of FIG. 1.

The layout of the above SAM will be described with reference to FIG. 3 showing a first layout of the main components.

Referring to FIG. 3, y memory blocks 31–3y are sequentially arranged in the row direction. Row select lines Qr1–Qrm for transmitting a row select signal output from row address pointer 1 passes through the side of memory blocks 31–3y to be connected to each of memory blocks 31–3y. Column select lines Qc1–Qcm for transmitting a column select signal output from column address pointer 2 are arranged above memory blocks 31–3y substantially in a linear manner. Such a layout allows reduction of the chip area in which an SAM is formed since an extra area dedicated for column select lines Qc1–Qcm is not required. Furthermore, row address pointer 1 may be arranged substantially at the center of memory blocks 31–3y in order to equalize the signal delay of a row select line in each memory block.

Arrangement of a bit line in a memory cell array employing the layout of FIG. 3 will be described hereinafter.

Figure 4:
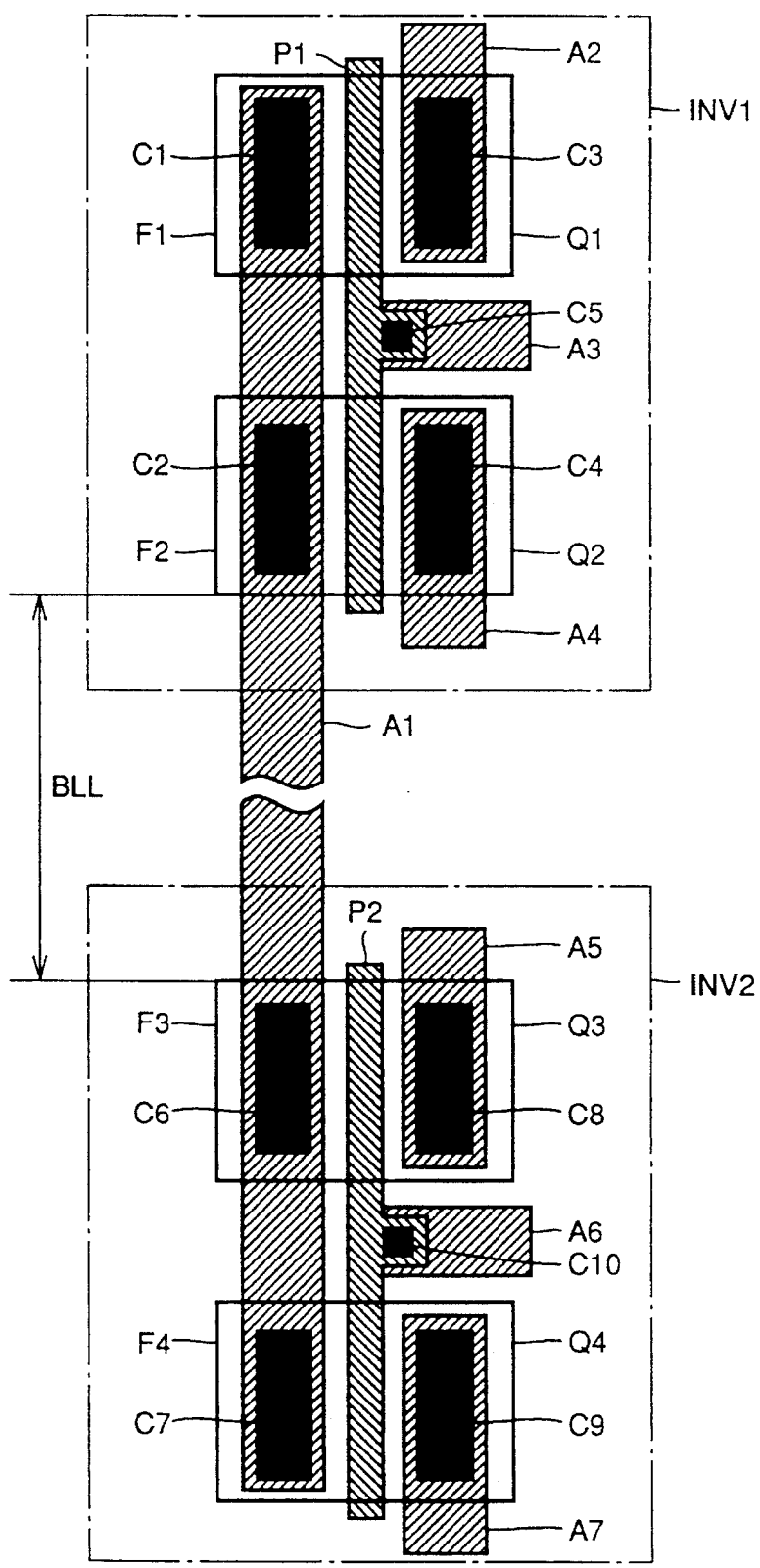
FIG. 4 is a layout diagram of the bit lines in the sequential access memory of FIG. 3.

Referring to FIG. 4, first metal layers A1–A7, polysilicon layers P1 and P2, field regions F1–F4, and contact holes C1–C10 are provided. First metal layer A1 forms a bit line. Field region F1, and polysilicon layer P1 form a p channel or an n channel MOS transistor Q1. Field region F2 and polysilicon layer P1 form an n channel or a p channel MOS transistor Q2. Transistors Q1 and Q2 form an output inverter INV1 included in input selector 4 showed in FIG. 1.

Similarly, polysilicon layer P2 and field regions F3 and F4 form transistors Q3 and Q4, respectively. Transistors Q3 and Q4 form input inverter INV2 in output selector 6 of FIG. 1.

First metal layer A1 serving as a bit line is arranged substantially linearly in the area of BLL. A bit line of each of memory blocks 31–3y is disposed substantially parallel to column select lines Qc1–Qcm of FIG. 3 and substantially in a linear manner. Therefore, the layout of the bit line in memory block 31 is similar to that of bit lines of the other memory block 32–3y. Memory cell array 31 can be formed by repeating the same pattern. Therefore, the manufacturing step can be simplified, and bit lines can be formed with higher accuracy. It is to be noted that the above-described bit line includes both a readout/write bit line.

A second layout of the main components of an SAM will be described with reference to FIG. 5.

Figure 5:
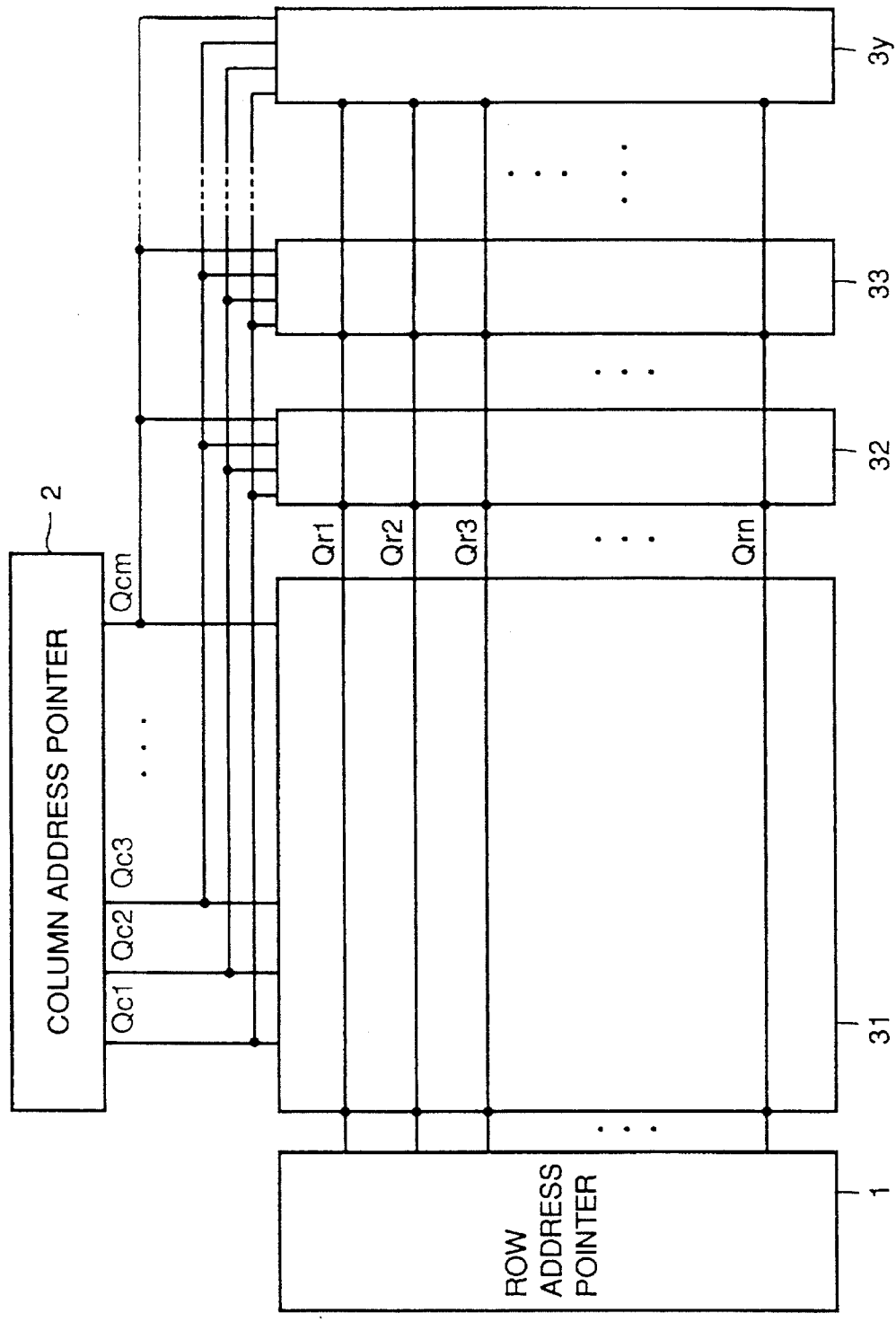
FIG. 5 is a second layout diagram of the main components of the sequential access memory of FIG. 1.

In the second layout shown in FIG. 5, memory blocks 31–3y are arranged in series in the column direction. Row select lines Qr1–Q4n for transmitting a row select signal output from row address pointer 1 are arranged in an overlapping manner on the plurality of memory blocks 31–3y. Column select lines Qc1–Qcm for transmitting a column select signal from column address pointer 2 are arranged above each of memory blocks 31–3y to be connected thereto. Therefore, an extra area for disposing column select signals Qr1–Qrm is not required, so that the chip area for the formation of an SAM can be reduced.

Similar to the first layout, by arranging the word lines in parallel to the column select lines, and disposing the word lines of each memory block corresponding to one row select lines substantially in a linear manner, a memory block can be formed by repeating the same layout pattern. Thus, the manufacturing steps can be simplified, and a word line can be formed with high accuracy.

Figure 6:
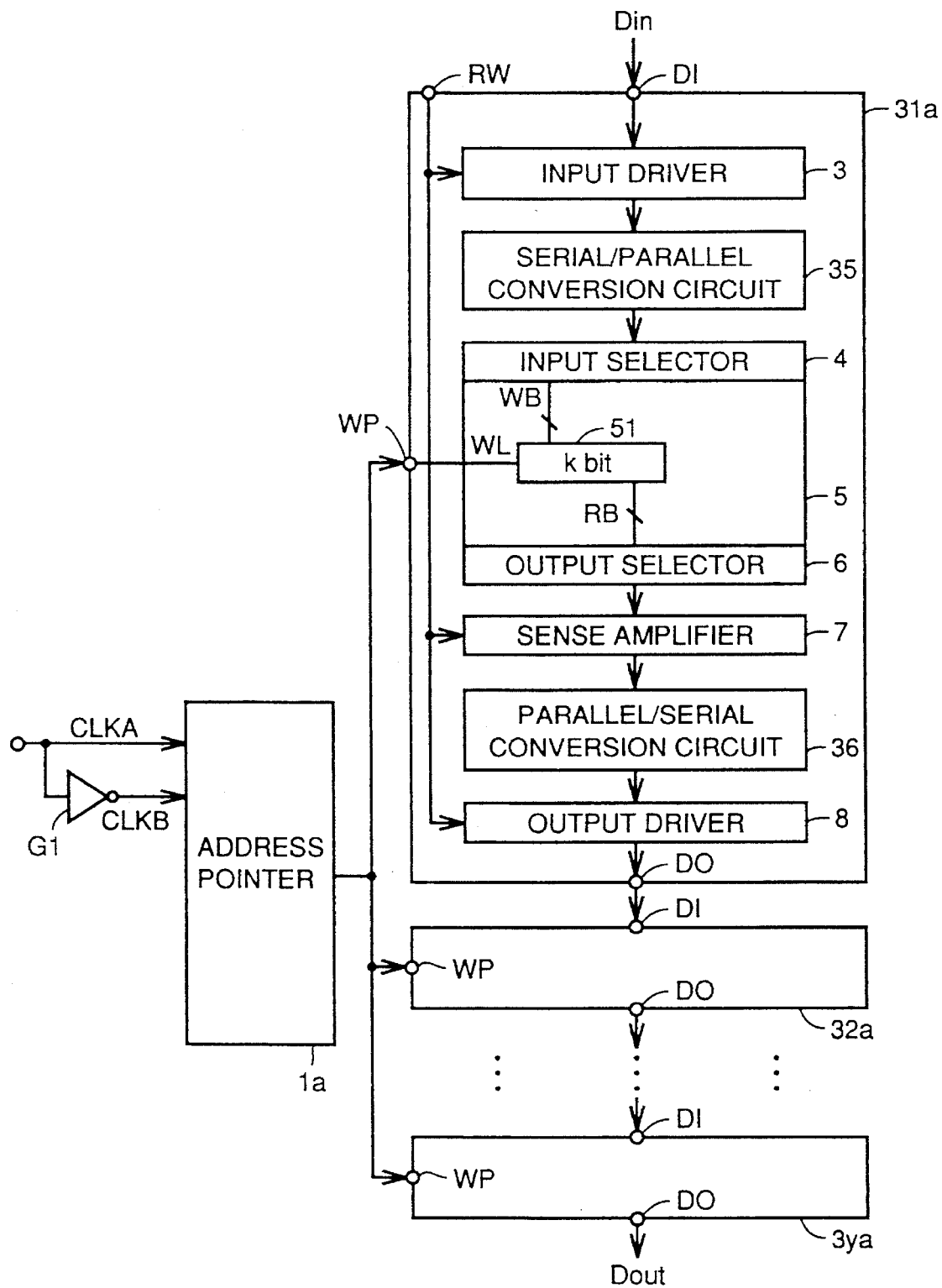
FIG. 6 shows a structure of the main components of a sequential access memory according to another embodiment of the present invention.

An SAM according to another embodiment of the present invention will be described with reference to FIG. 6 showing a structure of the main components of an SAM. The SAM of FIG. 6 differs from the SAM of FIG. 1 in that one address pointer 1a is provided instead of row and column address pointers 1, 2, and a serial/parallel conversion circuit 35 between input driver 3 and input selector 4, and a parallel/serial conversion circuit 36 between sense amplifier 7 and output driver 8 are provided. Also, row and column select signals Qri and Qcj are removed, so that the output of address pointer 1a is directly provided to word line WL. The remaining structure is similar to that of the SAM of FIG. 1 and their descriptions will not be repeated.

In the SAM of FIG. 6, address pointer 1a responds to clock signals CLKA and CLKB to shift a plurality of word line select signals at an H level, which are provided to a plurality of memory blocks 31a–3ya. In memory blocks 31a–3ya, a predetermined word line WL is selected according to an input word line select signal, whereby a corresponding memory circuit 51 is selected.

Data applied from input terminal DI is provided to serial/parallel conversion circuit 35 via input driver 3. The input serial data is converted into parallel data by serial/parallel conversion circuit 35 to be provided to input selector 4. Input selector 4 provides the input parallel data to memory circuit 51 via write bit line WB, whereby predetermined data is written into memory circuit 51.

The parallel data read out from memory circuit 51 is read out by sense amplifier 7 via readout bit line RB and output selector 6. The parallel data amplified by sense amplifier 7 is converted into serial data by parallel/serial conversion circuit 36 to be output to output driver 8. Output driver 8 provides the serial data from its output terminal DO to input terminal DI of a memory block of the next stage. Similar to the SAM of FIG. 1, when the above-described operation has been carried out for all the stages of memory block 31a–3ya, i.e. for y times, input data Din is output from output terminal DO of memory block 3ya which is the last stage as output data Dout.

The SAM of FIG. 6 can control the operation of a plurality of blocks using an address pointer corresponding to only one memory block. Therefore, the circuit complexity of the address pointer can be reduced. More specifically, when y memory blocks are used, the circuit complexity of the address pointer is reduced to 1/y. The chip area of the SAM and power consumption in the address pointer can be reduced. Thus, reduction in the power consumption of the device can be realized. Although the following description of each circuit is based upon the SAM of FIG. 1, they can be applied to the SAM of FIG. 6 with similar effects.

A specific structure of the memory circuit employed in the SAM of FIG. 1 will be described hereinafter with reference to FIG. 7.

Figure 7:
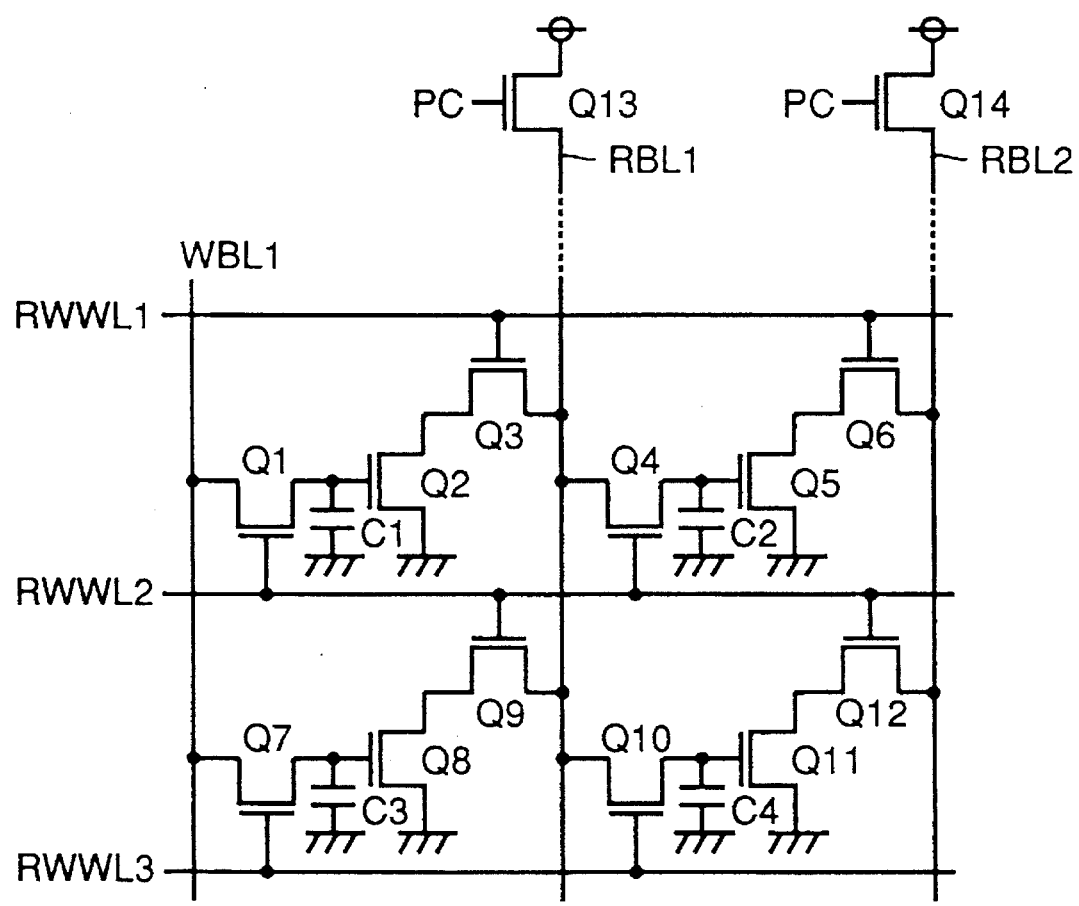
FIG. 7 is a circuit diagram showing a first specific structure of the memory circuit of FIG. 1.

Referring to FIG. 7 showing the first specific structure, a memory circuit includes a write bit line WBL1, a write and readout bit line RBL1, a readout bit line RBL2, write and readout word lines RWWL1–RWWL3, n channel MOS transistors Q1–Q12, and storage capacitors C1–C4.

Transistor Q1 is connected to write bit line WBL1 Transistor Q1 has its gate connected to word line RWWL2. Storage capacitor C1 is connected to ground potential and transistor Q1. Transistor Q2 has its gate connected to storage capacitor C1. Transistor Q2 is connected to ground potential and transistor Q3. Transistor Q3 has its gate connected to word line RWWL1. Transistor Q3 is connected to write and readout bit line RBL1. Transistors Q4–Q6 and storage capacitor C2, transistors Q7–Q9 and storage capacitor C3, and transistors Q10–Q12 and storage capacitors C4 are connected in a similar manner.

Readout bit line RBL1 is connected to a predetermined precharge voltage via transistor Q13. A predetermined precharge signal PC is applied to the gate of transistors Q13–Q14. Similarly, readout bit line RBL2 is connected to transistor Q14. Bit line RBL2 is connected to sense amplifier 7 shown in FIG. 1 via output selector 6. Readout bit line RBL1 is connected to sense amplifier 7.

Figure 8:
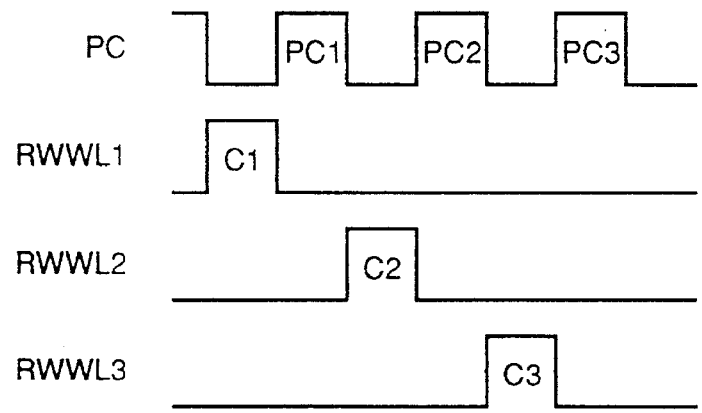
FIG. 8 is a timing chart for describing the operation of the memory circuit of FIG. 7.

The operation of the memory circuit of the above structure will be described hereinafter. FIG. 8 is a timing chart for describing the operation of the memory circuit of FIG. 7.

Referring to FIGS. 7 and 8, prior to word line RWWL2 attaining an H level at timing L2, precharge signal PC already attains an H level at timing PC1, and write and read bit line RBL1 and read bit line RBL2 are precharged to an H level. When word line RWWL2 attains an H level, transistors Q1, Q9, Q4, and Q12 are turned on. Here, the potential of write bit line WBL1 is held in storage capacitor C1 via transistor Q1. Since transistor Q9 is turned on, transistor Q8 is turned on when the potential held in storage capacitor C3 attains an H level, whereby the charge in write and readout bit line RBL1 is pulled down to an L level via transistors Q8 and Q9. When the potential held in storage capacitor C3 attains an L level, transistor Q8 is off, so that the potential of write and readout bit line RBL1 is maintained at an H level.

The potential of readout and write bit line RBL1 is held in storage capacitor C2 via transistor Q4 similar to storage capacitor C1. When the potential held in storage capacitor C4 attains an H level, the charge of readout bit line RBL2 is pulled down to an L level via transistors Q11 and Q12. When the potential held in storage capacitor C4 attains an L level, transistor Q11 is turned off, so that the potential of readout bit line RBL2 is maintained at the H level.

The potential of readout bit line RBL2 is amplified by sense amplifier 7 via output selector 6, which is provided as output data via output driver 8. This output data is the data of the second preceding T assuming that the period of the address pointer of one cycle is T. Thus, by using the above-described memory circuit, the area of the address pointer can be reduced to ½. Although the structure of a two-stage memory cell is described for providing data of the second preceding T in the above embodiment, the area of the address pointer can be reduced according to the number of stages forming the memory cells. The same applies for each of the following embodiments.

Figure 9:
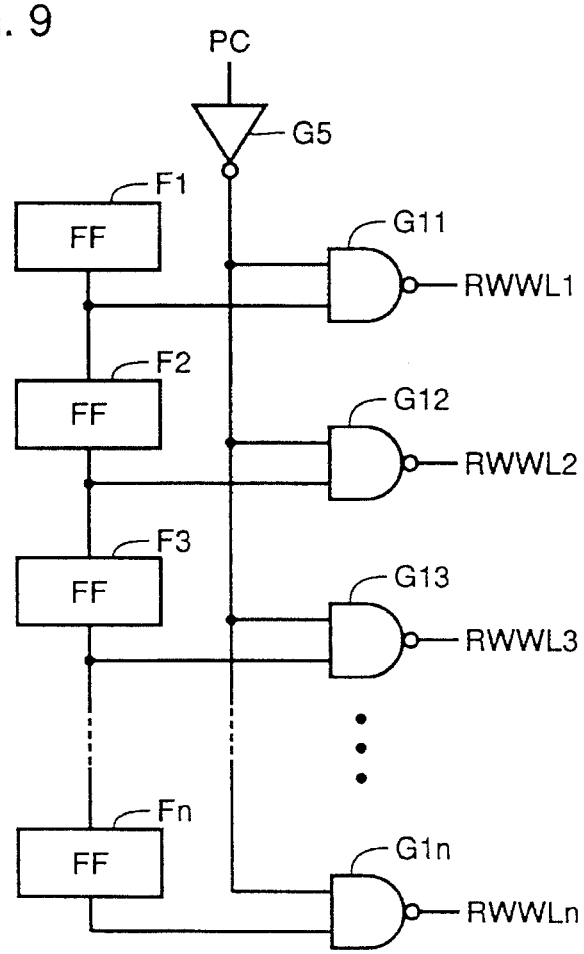
FIG. 9 is a circuit diagram showing a structure of a control signal generation circuit in the memory circuit of FIG. 7.

A control signal generation circuit of the memory circuit of FIG. 7 will be described with reference to FIG. 9 showing an exemplary structure thereof.

Referring to FIG. 9, a control signal generation circuit includes flipflop circuits (FF) F1–Fn, an inverter G5, and AND gates A11–A1n. Flipflop circuit F1 is connected to flipflop circuit F2 of the next stage and AND gate G11. Inverter G5 is connected to AND gate G11. Inverter G5 receives a precharge signal PC to provide an inverted signal thereof to AND gate A11. A control signal output from inverter G11 is provided to word line RWWL1 to select word line RWWL1. Similarly, the remaining n−1 flipflop circuits F2–Fn and AND gates G12–1n are connected to output a control signal provided to the other word lines WWL2–RWWLn.

According to the control signal generation circuit of the above structure, word lines RWWL1–RWWL3 attain an H level in response to a precharge signal PC at the timing shown in FIG. 7. A predetermined control signal is generated by a control signal generation circuit similar to that of FIG. 8 also in the following embodiments.

It is possible to reduce the area of the address pointer in the above-described memory circuit even when a plurality of memory blocks 31–3y are not connected in series as in the SAM of FIG. 1 and only one memory block is used, or when one address pointer is used. The same applies for the embodiments of the following memory circuits.

A second specific example of the memory circuit of FIG. 1 will be described with reference to FIG. 10.

Figure 10:
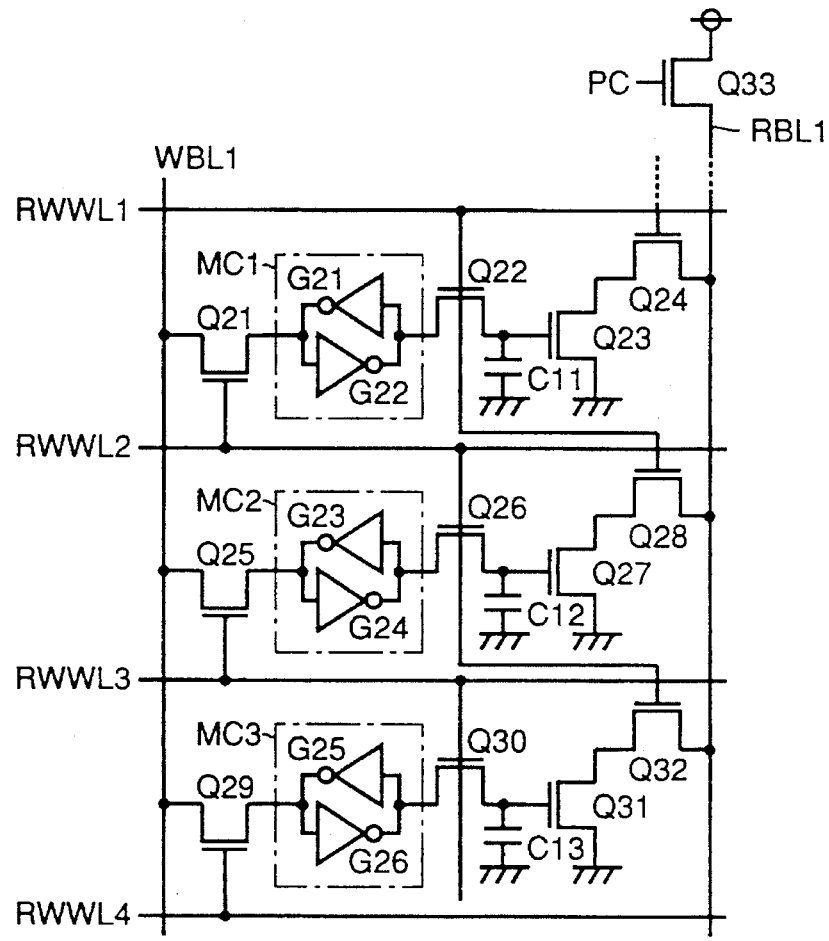
FIG. 10 is a circuit diagram showing a second specific structure of the memory circuit of FIG. 2.

Referring to FIG. 10, a memory circuit includes write and readout word lines RWWL1–RWWL4, a write bit line WBL1, a readout bit line RBL1, n channel MOS transistors Q21–Q32, inverters G21–G26, and capacitors C11–C13.

Transistor Q25 is connected to write bit line WBL1. Transistor Q25 has its gate connected to word line RWWL3. Two inverters G23 and G24 are cross-coupled to form a static memory cell MC2 which is connected to transistors Q25 and Q26. Each gate of transistors Q26 and Q32 is connected to word line RWWL2. Storage capacitor C12 is connected to transistor Q26. Transistor Q27 has its gate connected to storage capacitor C12. Transistor Q27 is connected to ground potential and transistor Q28. Transistor Q28 is connected to readout bit line RBL1. Transistor Q28 has its gate connected to word line RWWL1. Readout bit line RWL1 is connected to a predetermined precharge voltage via transistor Q33. A predetermined precharge signal PC is applied to the gate of transistor Q33.

The other transistors Q21–Q24, Q29–Q32, inverters G21, G22, G25, G26, and storage capacitors C11, C13 are connected in a similar manner. Therefore, inverters G21 and G22 form a static memory cell MC1, and inverters G25 and G26 form a static memory cell MC3.

Figure 11:
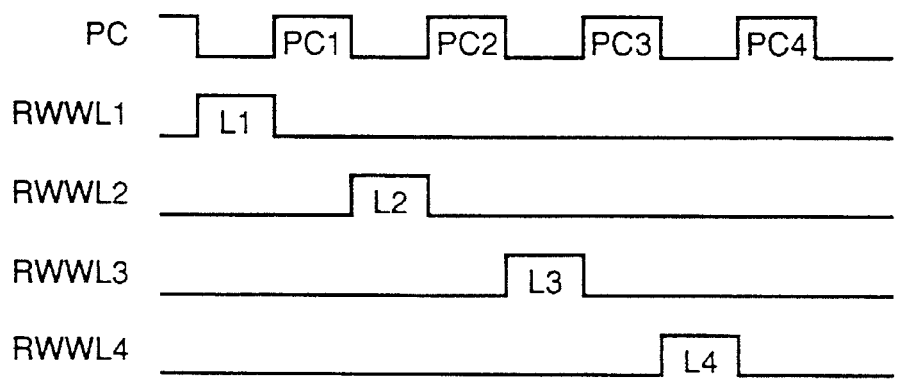
FIG. 11 is a timing chart for describing the operation of the memory circuit of FIG. 10.

The operation of the memory circuit of the above structure is described hereinafter. FIG. 11 is a timing chart for describing the operation thereof.

Referring to FIGS. 10 and 11, prior to timing L2 where word line RWWL2 attains an H level, readout bit line RWBL1 is precharged to an H level at timing PC1. Then, when word line RWWL2 attains an H level, transistors Q21, Q26 and Q32 are turned on. Here, the potential of write bit line WBL1 is held in memory cell MC1 via transistor Q21. Simultaneously, the potential held in memory cell MC2 is sent to storage capacitor C12 via transistor Q26. Therefore, when the potential of memory cell MC2 attains an H level and an L level, the potential of storage capacitor C12 attains an H level and an L level, respectively.

When the potential held in storage capacitor C13 attains an H level, transistor Q31 is turned on, whereby the potential of readout bit line RBL1 has the charge pulled down to an L level via transistors Q32 and Q31. When the potential held in strange capacitor C13 attains an H level, transistor Q31 is turned off, whereby the potential of readout bit line RBL1 is maintained at the H level. The potential of readout bit line RBL1 is sensed by a sense amplifier to be eventually output as the output data. Similar to the above-described first memory circuit, this output data is the data of the second preceding T where the period for the address pointer of one cycle is T. Thus, the area of the address pointer can be reduced to ½.

Figure 12:
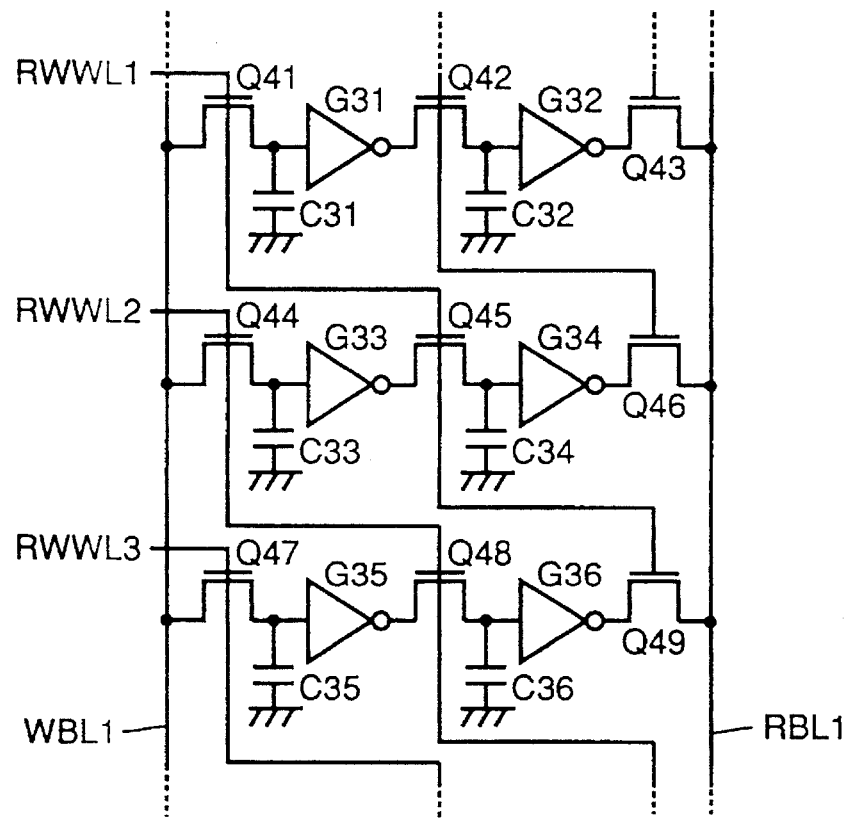
FIG. 12 is a circuit diagram showing a third specific structure of the memory circuit of FIG. 1.

A third specific example of a memory circuit will be described with reference to FIG. 12. Referring to FIG. 12, a memory circuit includes write and readout word lines RWWL1–RWWL3, a write bit line WBL1, a readout bit line RBL1, n channel MOS transistors Q41–Q49, storage capacitors C31–C36, and inverters G31–G36.

Transistor Q41 is connected to write bit line WBL1. Transistors Q41, Q45 and Q49 have each gate connected to word line RWWL1. Storage capacitor C31 is connected to ground potential and transistor Q41. Inverter G31 is connected to storage capacitor C31. Transistor Q42 is connected to inverter G31. Capacitor C32 is connected to transistor Q42. Inverter G32 is connected to storage capacitor C32. Transistor Q43 is connected to readout bit line RBL1. The other transistors Q44–Q49, storage capacitors C33–C36, and inverters G33–G36 are connected in a similar manner.

Figure 13:
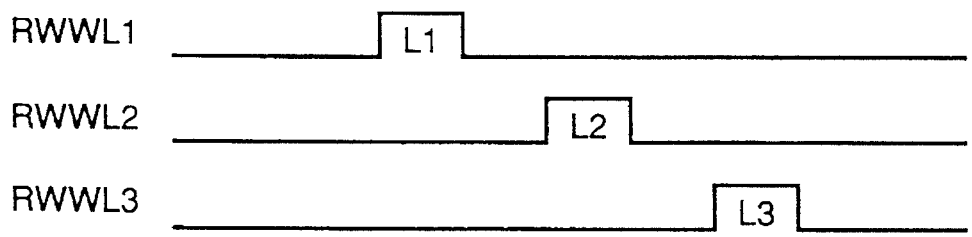
FIG. 13 is a timing chart for describing the operation of the memory circuit of FIG. 12.

The operation of the memory circuit of the above structure will be described hereinafter. FIG. 13 is a timing chart for describing the operation thereof.

The timing L1 when word line RWWL1 attains an H level will be described with reference to FIGS. 12 and 13. When word line RWWL1 attains an H level, transistors Q41, Q45 and Q49 are turned on. Here, the potential of write bit line WBL1 is held in storage capacitor C31 via transistor Q41. Simultaneously, the potential held in storage capacitor C33 is sent to storage capacitor C34 via inverter G33 and transistor Q45. Therefore, when the potential of storage capacitor C33 attains an H level and an L level, the potential of storage capacitor C34 attains an L level and an H level, respectively.

The potential of storage capacitor C36 is read out to readout bit line RBL1 via inverter G36 and transistor Q49. Therefore, when the potential held in storage capacitor C36 attains an L level and an H level, the potential of readout bit line RBL1 attains an H level and an L level, respectively.

Then, the potential of readout bit line RBL1 is amplified to be eventually provided as the output data. This output data is the data of the second preceding T assuming that the period of the address pointer is T. Thus, the area of the address pointer can be reduced to ½.

Figure 14:
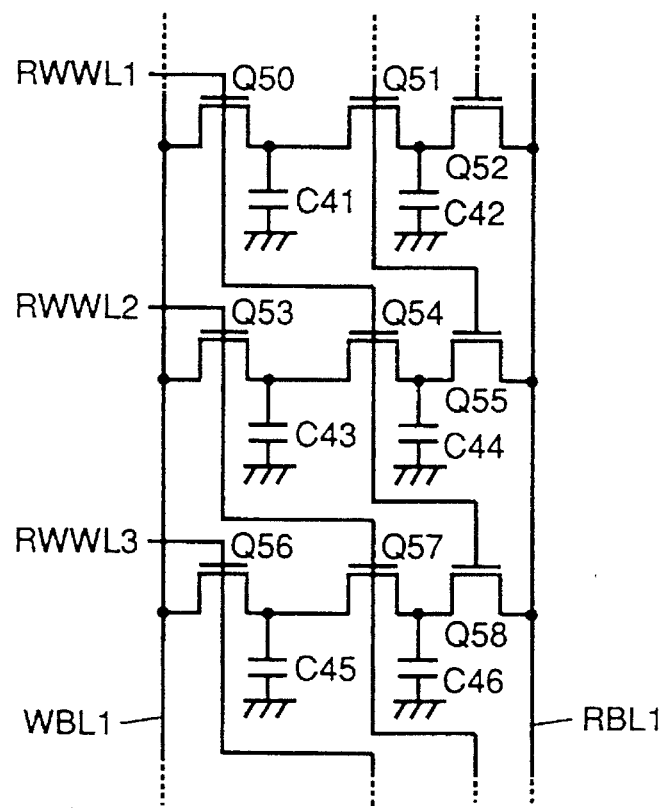
FIG. 14 is a circuit diagram showing a fourth specific structure of the memory circuit of FIG. 4.
Figure 15:
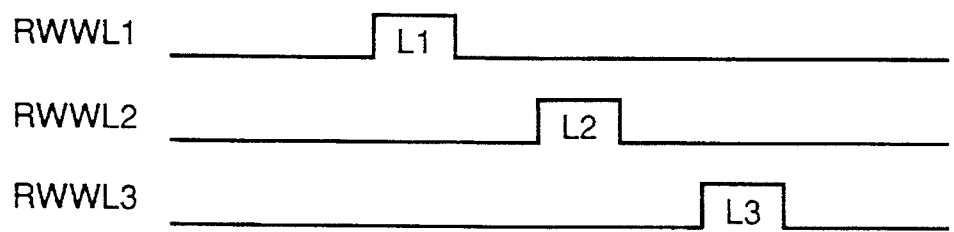
FIG. 15 is a timing chart for describing the operation of the memory circuit of FIG. 14.

A fourth specific example of a memory circuit will be described with reference to FIG. 14 showing a circuit diagram thereof and the timing chart of FIG. 15.

The memory circuit of FIG. 14 differs from the memory circuit of FIG. 12 in that inverters G31–G36 are removed. The remaining structure is similar to that of FIG. 12, and an operation is carried out similar to that described with reference to FIGS. 12 and 13. Similar to the third memory circuit, the data of the second preceding T is output, and the area of the address pointer can be reduced to ½.

A fifth example of a memory circuit will be described with reference to the circuit diagram of FIG. 16.

Figure 16:
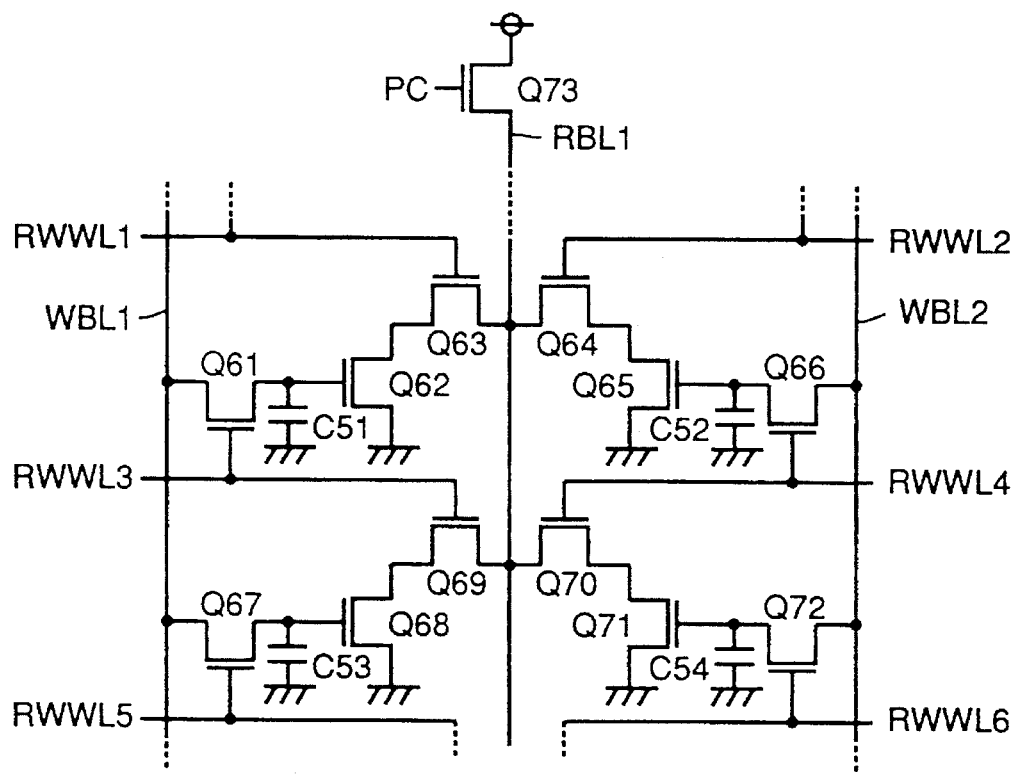
FIG. 16 is a circuit diagram showing a fifth specific structure of the memory circuit of FIG. 1.

Referring to FIG. 16, a memory circuit includes write and readout word lines RWWL1–RWWL6, write bit lines WBL1, WBL2, a readout bit line RBL1, n channel MOS transistors Q61–Q72, and storage capacitors C51–C54.

Transistor Q61 is connected to write bit line WBL1. Each of transistors Q61 and Q69 has its gate connected to word line RWWL2. Transistor Q61 is connected to storage capacitor C51. Storage capacitor C51 is connected to transistor Q61 and ground potential. The gate of transistor Q62 is connected to storage capacitor C51. Transistor Q62 is connected to ground potential and transistor Q63. The gate of transistor Q63 is connected to word line RWWL1. Transistor Q63 is connected to readout bit line RBL1. The other transistors Q64–Q72 and storage capacitors C52–C54 are connected in a similar manner. Readout bit line RBL1 is connected to a predetermined precharge voltage via transistor Q73, whereby a predetermined precharge signal PC is applied to the gate of transistors Q73.

As described above, in the memory circuit of FIG. 16, two write bit lines WBL1 and WBL2 commonly share one readout bit line RBL1.

Figure 17:
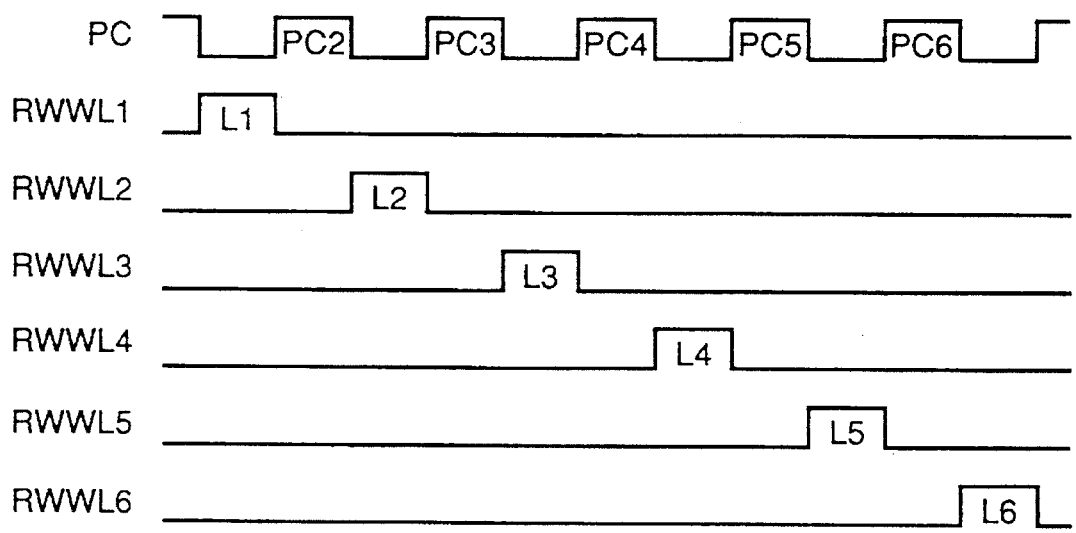
FIG. 17 is a timing chart for describing the operation of the memory circuit of FIG. 16.

The operation of the memory circuit of the above structure will be described with reference to the timing chart of FIG. 17.

The operation of the memory circuit at timing L3 where word line RWWL3 attains an H level will be described with reference to FIGS. 16 and 17. Prior to word line RWWL3 attaining an H level, the potential of readout bit line RBL1 is precharged to an H level at timing PC3. Then, when word line RWWL3 attains an H level at timing L3, transistors Q61 and Q69 are turned on. Here, the potential of write bit line WBL1 is held in storage capacitor C51. Simultaneously, when the potential of storage capacitor C53 attains an H level, transistor Q63 is turned on, whereby the potential of readout bit line RBL1 is pulled down to an H level via transistors Q69 and Q68. When the potential of storage capacitor C53 attains an L level, transistor Q68 is turned off, whereby the potential of readout bit line RBL1 is held at an H level. By reading out the above two states with a sense amplifier, the data stored in the memory cell can be read out.

The operation of the memory circuit at timing L4 where word line RWWL4 attains an H level will be described. Prior to word line RWWL4 attaining an H level, the potential of readout bit line RBL1 is precharged to an H level at timing PC4. When word line RWWL4 attains an H level at timing PC4, transistors Q66 and Q70 are turned on. Here, the potential of write bit line WBL2 is stored in storage capacitor C52. Simultaneously, when the potential of storage capacitor C54 attains an H level, transistor Q71 is turned on, whereby the potential of readout bit line RBL1 is pulled down to an L level via transistors Q70 and Q71. When the potential of storage capacitor C54 attains an L level, transistor Q71 is turned off, whereby the potential of readout bit line RBL1 is left at the H level. By reading out the above two states with a sense amplifier, the data stored in the memory circuit can be read out.

As described above, in the memory circuit of FIG. 15, data stored in memory cells holding the data of the two write bit lines (here, storage capacitors C51–C54) can be read out by one readout bit line. Therefore, the number of bit lines is reduced, so that the area of the memory cell array can be reduced.

A specific example of the row and column address pointers of FIG. 1 will be described. Although a row address pointer is described in the following, the same structure may be applied to a column address pointer. Furthermore, the following address pointer can be applied to an SAM using only one memory block, in addition to the case where a plurality of memory blocks are connected in series as shown in FIG. 1. Furthermore, the following address pointer can be applied to the SAM of FIG. 6. In this case, the address pointer and the word line in a memory block are connected.

A first specific example of a row address pointer will be described with reference to the block diagram of FIG. 18.

Figure 18:
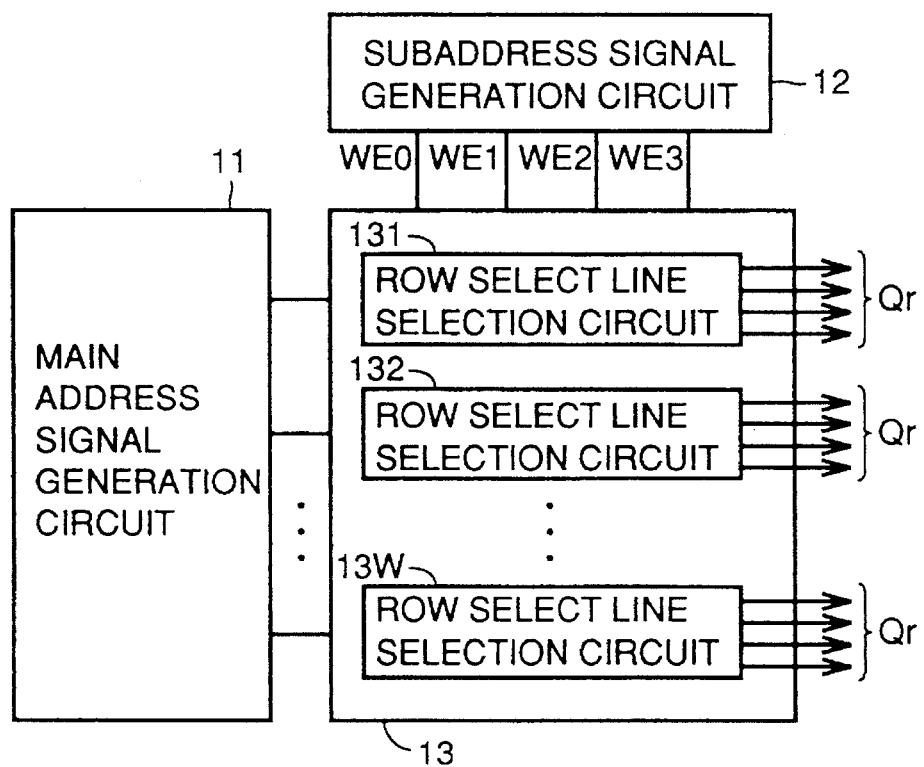
FIG. 18 is a block diagram showing a first specific structure of the row address pointer of FIG. 1.

Referring to FIG. 18, a row address pointer includes a main address signal generation circuit 11, a subaddress signal generation circuit 12, and a row select line selection unit 13. Row select line selection unit 13 includes row select line selection circuits 131–13W.

Main address generation circuit 11 generates main address signals of W lines, for example, to provide the same to row select line selection unit 13. Row select line selection unit 13 includes W row select line selection circuits 131–13W corresponding to each main address signal. A main address signal is applied to a corresponding one of row select line selection circuits 131–13W.

Subaddress signal generation circuit 12 provides four subaddress signal WE0–WE3 to row select line selection unit 13. Four subaddress signals WE0–WE3 are applied to each of row select line selection circuits 131–13W, respectively. Row select line selection circuit 131 responds to one input main address signal and four subaddress signals WE0–WE3 to select a predetermined one of the four word lines WL. The same apply for the other row select line selection circuits 132–13W.

A first specific example of the subaddress signal generation circuit of FIG. 18 will be described with reference to FIG. 19.

Figure 19:
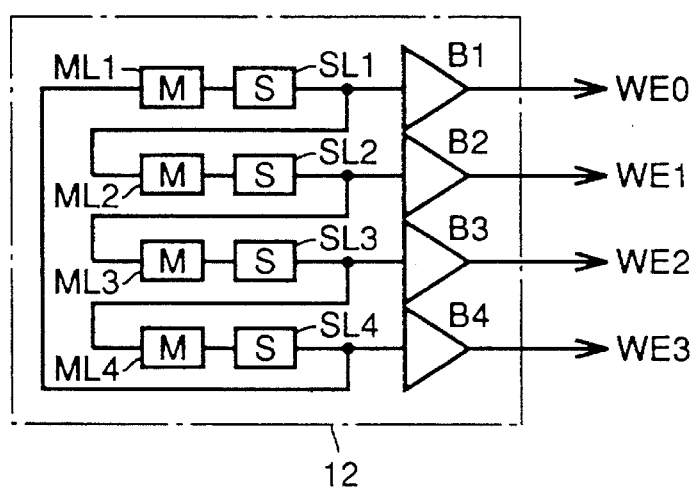
FIG. 19 shows a first specific structure of a subaddress signal generation circuit of FIG. 18.

Referring to FIG. 19, a subaddress signal generation circuit includes master latches (M) ML1–ML4, slave latches (S) SL1–SL4, and buffer circuits B1–B4. Master latch ML1 and slave latch SL1 form one master slave type latch. Master latches ML1–ML4 and slave latches SL1–SL4 are connected alternately. The output of slave latch SL4 which is the last stage is applied to master latch SL1 which is the first stage. Therefore, a shift register is formed having four master slave type latches connected in a ring manner. The output of slave latch SL1 is applied to buffer circuit B1 to be output as subaddress signal WE0. Similarly, slave latches SL2–SL4 and buffer circuits B2–B4 are connected to output subaddress signals WE1–WE3, respectively.

In the shift register of the above structure, the initial state is set so that one of the four slave latches SL1–SL4 output data of an H level, and the remaining three slave latches output data of an L level. Buffer circuits B1–B4 are formed of a two-stage inverter. According to such a structure, subaddress signal generation circuit 12 provides subaddress signals WE0–WE3 which attain an H level for only a predetermined time period.

The main address signal generation circuit and the row select line selection unit shown in FIG. 18 will be described in further detail according to the block diagram of FIG. 20. For the sake of simplifying the description, the main address signal generation circuit and the row select line selection unit are only partially shown.

Figure 20:
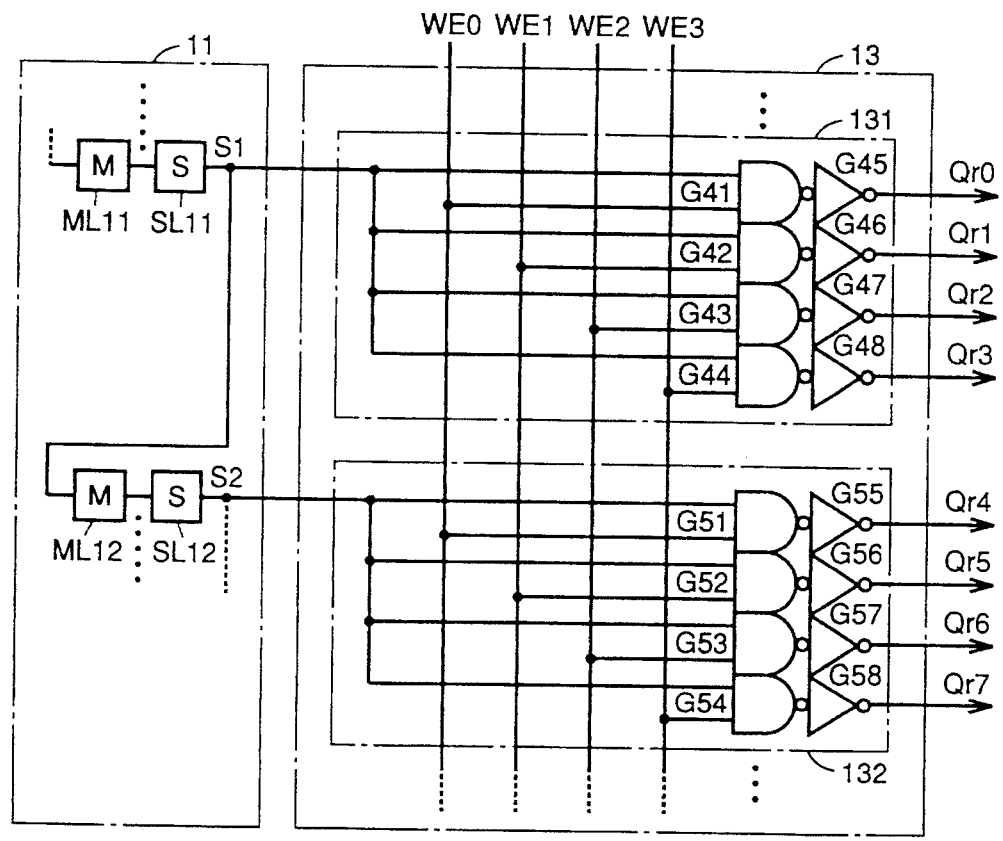
FIG. 20 shows a first specific structure of the main address signal generation circuit and the row select line selection unit of FIG. 18.

Referring to FIG. 20, a main address signal generation circuit 11 includes master latches ML1, ML12, and slave latches SL11, SL12. Master latch ML11 and slave latch SL11 form one master slave type latch. When they correspond to 4W lines of row select lines, W master latches and W slave latches are connected alternately in a ring manner similar to that of subaddress signal generation circuit 12 of FIG. 19. Each output of slave latches SL11 and SL12 are provided to row select line selection unit 13.

The initial state of main address signal generation circuit 11 is set so that only one of the W slave latches provide an output of an H level, and all the other slave latches provide an output of an L level. Two phases of non-overlapping clock signals CK1 and CK2 are applied to main address signal generation circuit 11. In response, data is sequentially shifted by a master slave type latch. When the data repeating period of subaddress signal generation circuit 12 is 1 cycle, 4 cycles correspond to 1 clock period, and clock signals CK1 and CK2 are equal to the outputs of buffer circuits B1 and B3.

A row select line selection unit will be described hereinafter. Referring to FIG. 20, a row select line selection unit 13 includes row select line selection circuits 131 and 132. Row select line selection circuit 131 includes NAND gates G41–G44, and inverters G45–G48. Row select line selection circuit 132 includes AND gates G51–G54 and inverters G55–G58.

An output signal S1 of slave latch SL11 is applied to NAND gates G41–G44. A subaddress signal WE0 is applied to NAND gate G41. Similarly, subaddress signals WE1–WE3 are applied to NAND gate G42–G44, respectively. NAND gate G41 takes the logical product of an applied output signal S1 and subaddress signal WE0. The result is inverted to be applied to inverter G45. Inverter G45 further inverts the input signal to output the same as row select signal Qr0. NAND gates G42–G44 and inverters G46–G48 output row select signals Qr1–Qr3, respectively, in a similar manner. Row select line selection circuit 132 has a structure similar to that of the above-described row select line selection circuit 131 to provide column select signals Qr4–Qr7.

The operation of a row address pointer of the above structure will be described with reference to FIGS. 21.

Figure 21:
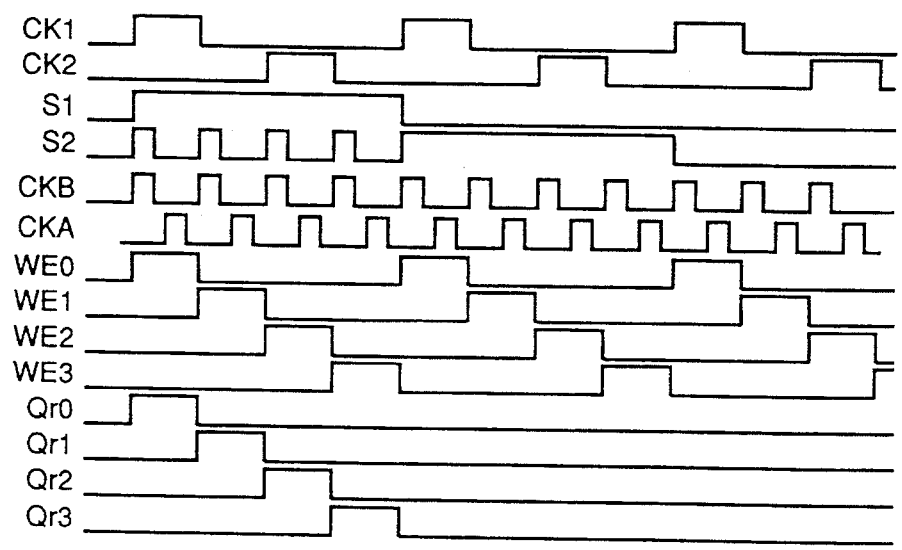
FIG. 21 is a timing chart for describing the operation of the subaddress signal generation circuit, the main address signal generation circuit, and the row select line selection unit shown in FIGS. 19 and 20.

Referring to FIG. 21, in response to clock signals CKA and CKB, a shift register formed of a master slave latch in subaddress signal generation circuit 12 sequentially shifts data, whereby subaddress signals WE0–WE3 are sequentially rendered to an H level. Each subaddress signal attains an H level for every 4 periods of clock signal CKB.

Master slave latches ML11, SL11, and ML12, SL12 respond to clock signals CK1 and CK2 to output sequentially output signals S1 and S2 at an H level.

Row select line selection unit 13 responds to main address signals S1, S2 and subaddress signals WE0–WE3, whereby only the NAND gate having both input signals attaining an H level provide a signal of an L level to an inverter, which then outputs a signal of an H level. Therefore, one of column select signals Qr0–Qr3 attains an H level. Thereafter, the state of an H level is shifted. As described above, a row address pointer is separated into a main address signal generation circuit and a subaddress signal generation circuit, wherein only one row select signal attains an H level according to the states of the main and subaddress signals. The state of an H level is shifted to sequentially select a predetermined row select line. When the above address pointer is used in the SAM of FIG. 6, row select signals Qr0–Qr3 serve as a word line select signal to be directly applied to word line WL, whereby a predetermined word line is sequentially selected. The same applies for each of the following address pointer.

Figure 22:
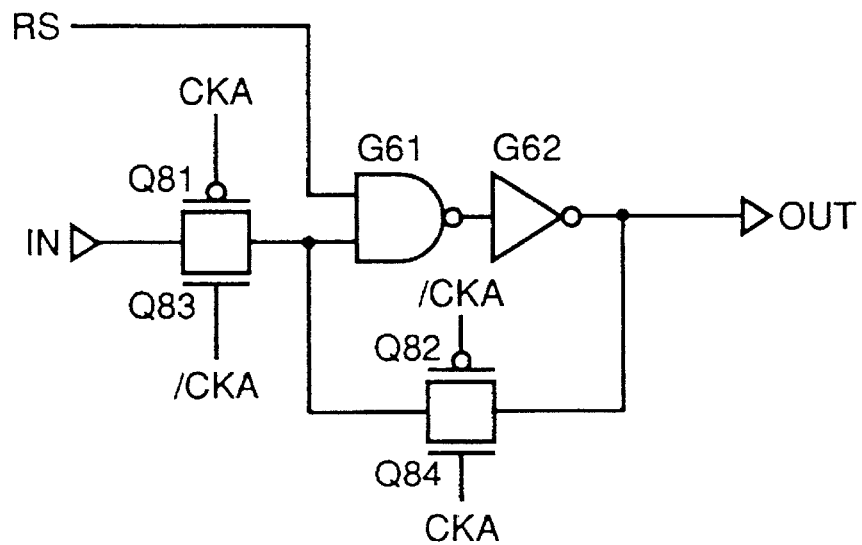
FIG. 22 shows a first specific structure of a half latch.

A half latch which becomes the main latch and the slave latch used in the above-described main address signal generation circuit and subaddress signal generation circuit will be described in detail with reference to Fig. 22 showing a first specific example of a half latch.

Referring to FIG. 22, a half latch includes P channel MOS transistors Q81, Q82, n channel MOS transistors Q83, Q84, an NAND gate G61, and an inverter G62.

Figure 32:
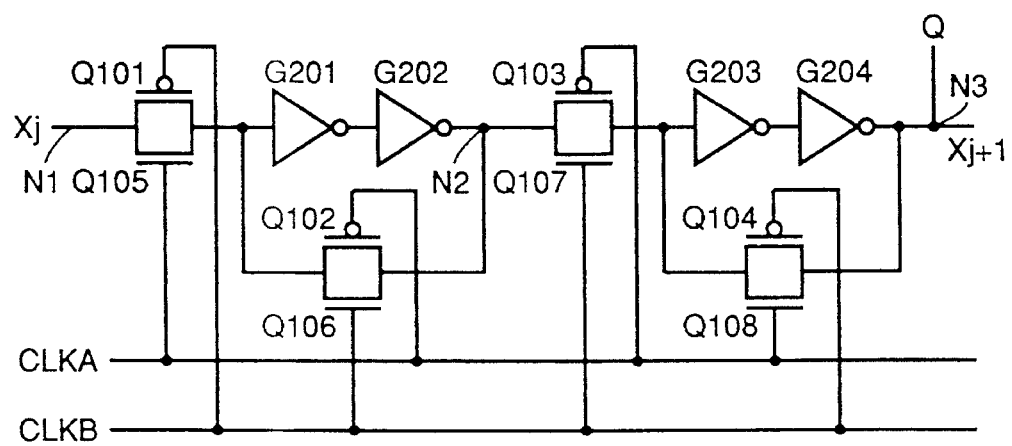
FIG. 32 is a circuit diagram showing an example of a register included in the row and column address pointer FIG. 30.
Figure 33:
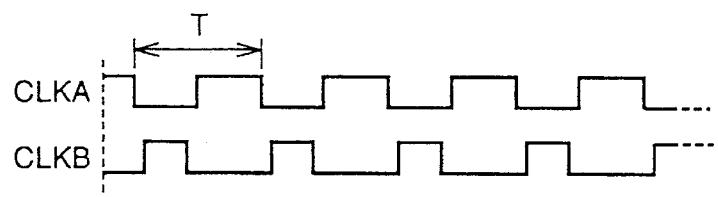
FIG. 33 is a timing chart showing a clock signal applied to the register of FIG. 32.
Figure 34:
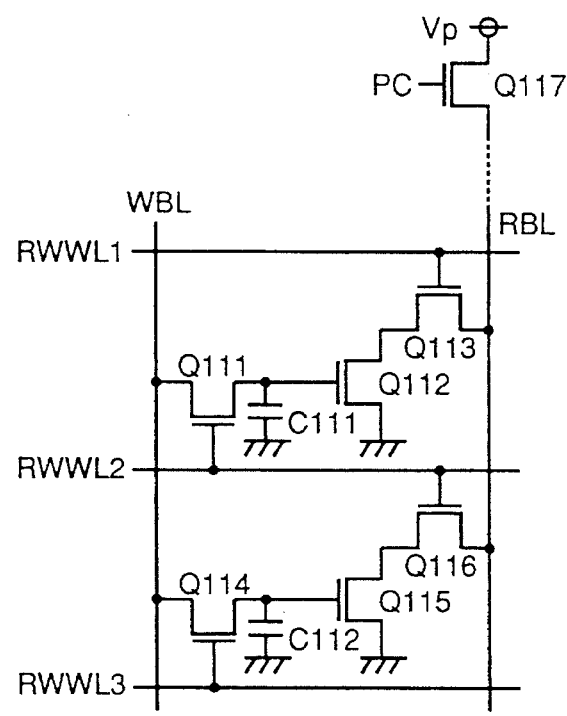
FIG. 34 shows an example of the memory circuit of FIG. 30.
Figure 35:
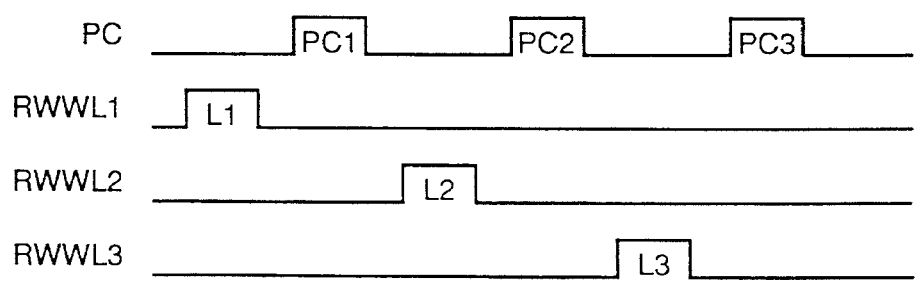
FIG. 35 is a timing chart for describing the operation of the memory circuit of FIG. 34.

Transistors Q81 and Q83, and Q82 and Q84 form a transmission gate, and an input signal is applied to transistors Q81 and Q83. A predetermined clock signal CKA is applied to the gate of transistor Q81. A clock signal CKA ("/" implies a complementary signal) which is complementary to clock signal CKA is applied to the gate of transistor Q83. Transistors Q81 and Q83 are connected to NAND gate Q61, and transistors Q82 and Q84. A reset signal RS is applied to NAND gate G61. NAND gate G61 is connected to inverter G62 which provides an output signal. This output signal is fed back to transistors Q82 and Q84. A clock signal/CKA is applied to the gate of transistor Q82. A clock signal CKA is applied to the gate of transistor Q84. The half latch of the above structure operates in a manner similar to that of the register described with reference to FIG. 32 provided that the half latch is reset in response to a reset signal RS.

Figure 23:
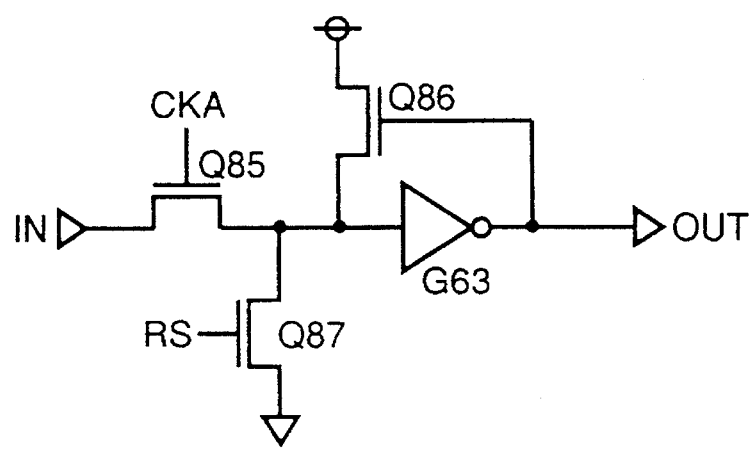
FIG. 23 shows a second specific structure of a half latch.

A second specific example of a half latch will be described with reference to FIG. 23. Referring to FIG. 23, a half latch includes n channel MOS transistors Q85–Q87, and an inverter G63. An input signal is applied to transistor Q85, and a predetermined clock signal CKA is applied to the gate of transistor Q85. Transistor Q87 is connected to transistor Q85 and ground potential. The gate of transistor Q87 receives reset signal RS. Transistor Q85 is connected to inverter G63 which provides an output signal. The output signal is applied to the gate of transistor Q86. Transistor Q86 is connected to power supply voltage $V_{CC}$ and to the input side of inverter G63.

A half latch of the above structure pulls up an output signal only when the input signal attains an L level. In comparison with the half latch of the full CMOS of FIG. 22, the number of used transistors can be reduced to a half.

The number of transistors used in a row address pointer of the above structure will be described. In order to compare the effect of the reduced number of transistors by the above row address pointer, the number of transistors is shown in Table 1 of an address pointer which is not divided into a main address signal generation circuit and a subaddress signal generation circuit and that uses one shift register for one row select line. The number of transistors used in the above-described row address pointer is shown in Table 2. Tables 1 and 2 show the number of transistors in the case of 200 words with the above-described W as 50. The half latch shown in FIG. 22 is used.

It is appreciated form the above tables that the address pointer using one shift register for one row select line includes 4800 transistors, whereas the above-described row address pointer uses 2312 transistors. Therefore, the number of transistors to be employed is reduced to approximately half. When the half latch of FIG. 23 is used, it is appreciated from Table 1 that the number is 2800 transistors, and 1772 transistors in Table 2. Thus, the number of transistors to be used is reduced to a half.

By using the above row address pointer, the number of transistors employed is reduced. Thus, the area of the row address pointer can be reduced.

The above embodiment was described in which the total number of word lines in an SAM is 4W words. This is because the subaddress signal generation circuit is formed with 4 cycles as one unit, wherein an integer multiple of 4 is appropriate for the sake of simplifying the description. The present invention is similarly applicable for word lines of other numbers. The same applies for the following described address pointer.

A second specific example of subaddress signal generation circuit will be described with reference to FIG. 24.

Figure 24:
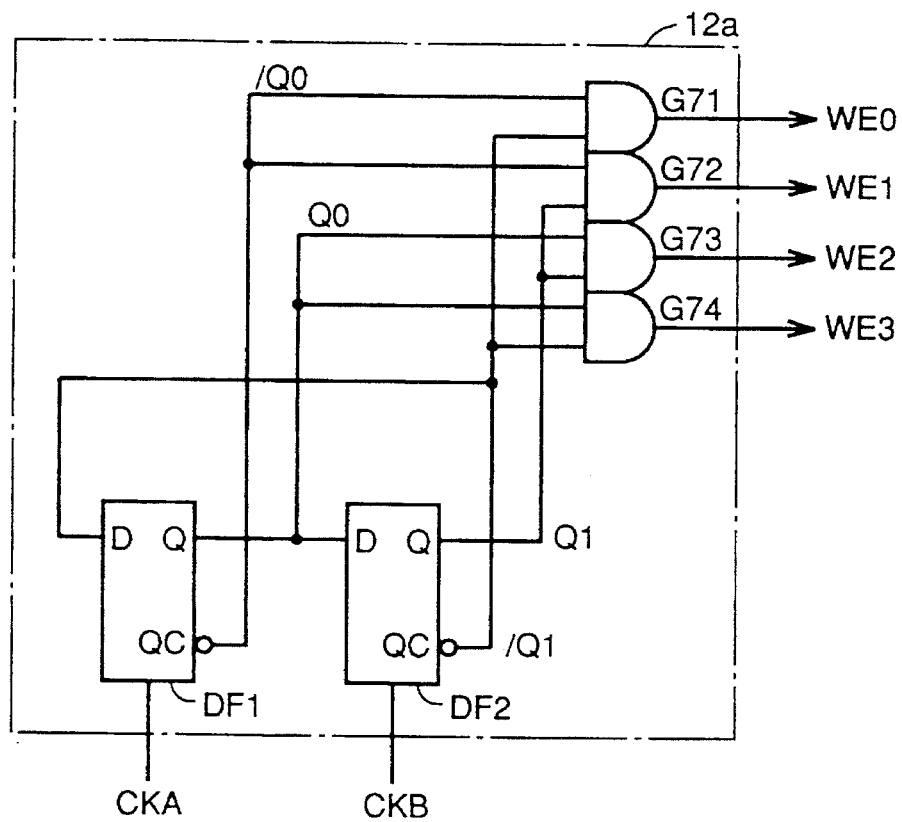
FIG. 24 shows a second specific structure of the subaddress signal generation circuit of FIG. 18.

Referring to FIG. 24, a subaddress signal generation circuit includes half latches DF1, DF2, and AND gates G71–G74. Half latch DF1 operates in response to an applied clock signal CKA. Half latch DF2 operates in response to an applied clock signal CKB. Clock signal CKB generates a clock pulse once for every period of clock signal CKA attaining an L level. An output signal/Q1 from output terminal QC of half latch DF2 is applied to input terminal D2 of half latch DF1. Half latch DF1 latches an applied output signal/Q1 in response to a clock signal CKA to provide an output signal Q0 from output terminal Q. From output terminal QC, an inverted signal/Q0 is output.

Output signal Q0 is applied to input terminal D of half latch DF2, and also to AND gates G73 and G74. Output signal/Q0 is applied to AND gates G71 and G72. Half latch D2 latches an applied output signal Q0 in response to clock signal CKB to provide an output signal Q1 from output terminal Q. From output terminal QC, an inverted signal/Q1 is output. Output signal Q1 is applied to AND gates G72 and G73. Output signal/Q1 is applied to AND gates G71 and G72. AND gates G71–G74 take the logical product of the respectively input signals which are output as subaddress signals WE0–WE3. The above-described half latches DF1 and DF2 form a Johnson counter.

Figure 25:
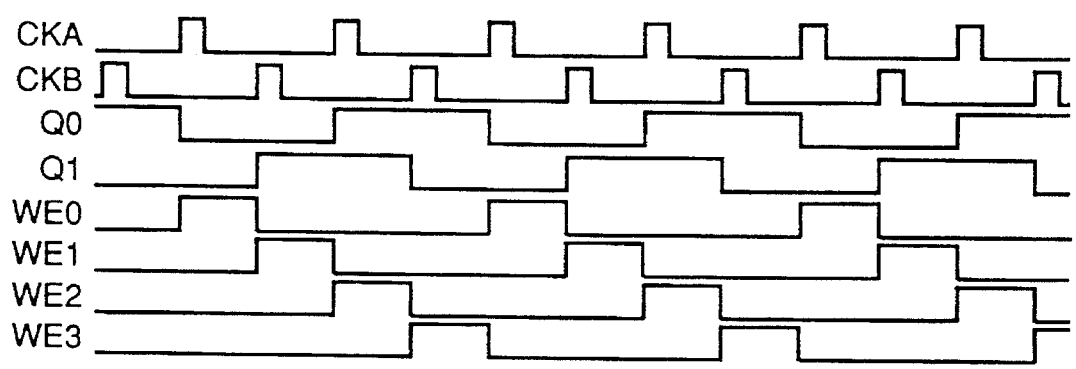
FIG. 25 is a timing chart for describing the operation of the subaddress signal generation circuit of FIG. 24.

The operation of the subaddress generation circuit of the above structure will be described with reference to the timing chart of FIG. 25. Referring to FIG. 25, half latches

TABLE 1

| Circuit | Internal circuit | Number of circuits | Number of transistors per unit | Number of transistors with 200 words (W = 50) |
|---|---|---|---|---|
| Address signal generation circuit | Half latch | 8W | 10 | 4000 |
|  | Buffer circuit | 4W | 4 | 800 |
| Total |  |  |  | 4800 |

TABLE 2

| Circuit | Internal circuit | Number of circuits | Number of transistors per unit | Number of transistors with 200 words (W = 50) |
|---|---|---|---|---|
| Subaddress signal generation circuit | Half latch | 8 | 10 | 80 |
|  | Buffer circuit | 8 | 4 | 32 |
| Main address signal generation circuit | Half latch | 2W | 10 | 1000 |
| Word line selection unit | NAND gate | 4W | 4 | 800 |
|  | Buffer circuit | 4W | 2 | 400 |
| Total |  |  |  | 2312 |

DF1 and DF2 forming a Johnson counter provides an output signal repeating the four states of (L, L)→(L, H)→(H, H)→(H, L). Here, when input signals of AND gates G71–G74 are (L, L), (L, H), (H, L), the output thereof attains an L level. A signal of an H level is output when the input signal is (H, H). Therefore, the four subaddress signals WE0–WE3 are output at an H level for only a predetermined time period in response to clock signals CKA and CKB, whereby the state of an H level is shifted sequentially. Thus, subaddress signals WE0–WE3 are provided similar to those shown in FIG. 21.

The above-described subaddress signal generation circuit has a number of half latches fewer than those used in the subaddress signal generation circuit of FIG. 19. Therefore, the area thereof can be reduced.

A second specific example of a main address signal generation circuit and a row select line selection unit will be described with reference to FIG. 26.

Figure 26:
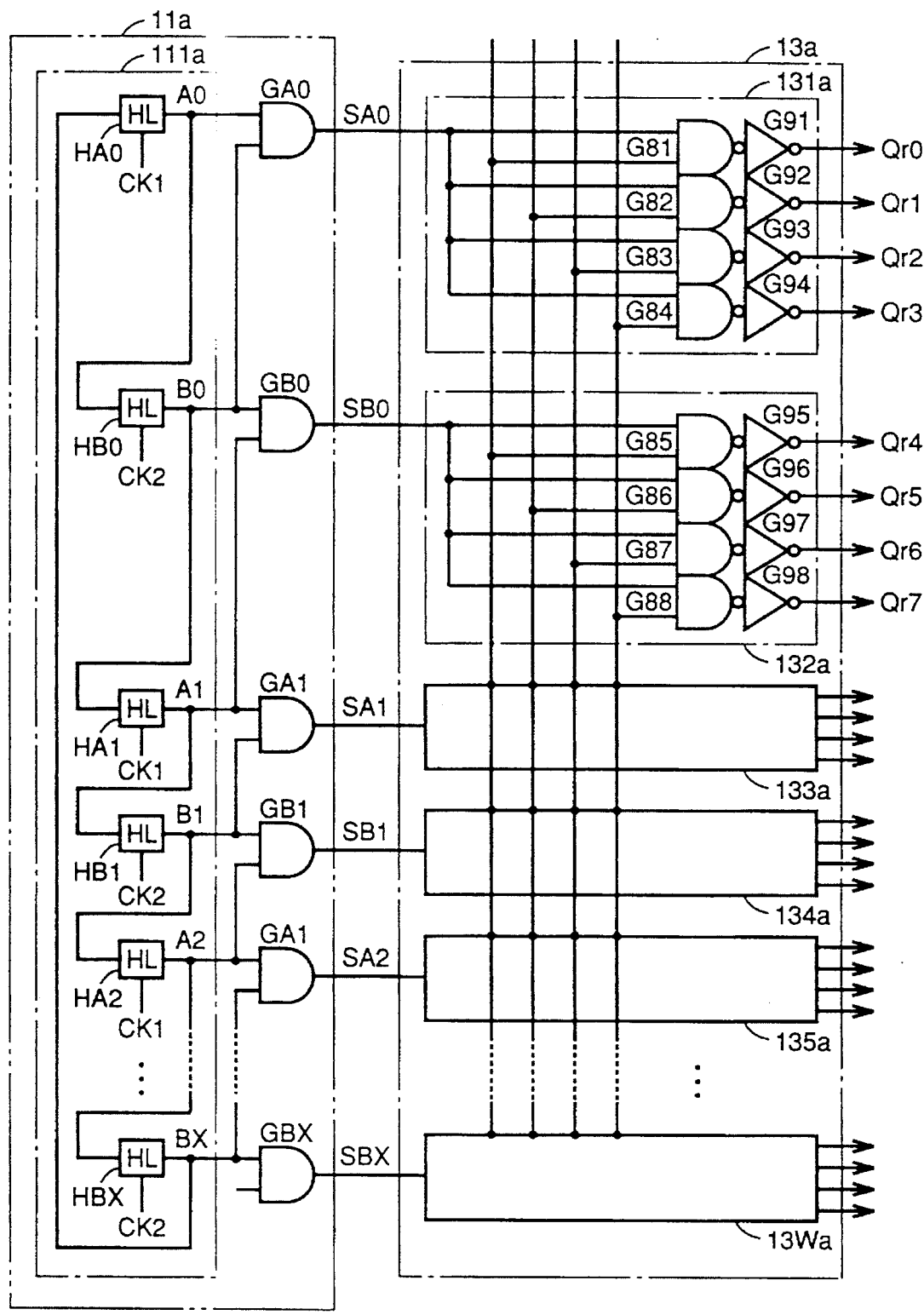
FIG. 26 shows a second specific structure of the main address signal generation circuit and the row select line selection unit of FIG. 18.

Referring to FIG. 26, a main address signal generation circuit 11a includes a shift register 111a, and AND gates GA0–GAX, GB0–GBX. Shift register 111a includes half latches (HL) HA0–HAX, HB0–HBX.

The X half latches HA0–HAX carry out a latch operation in response to an applied clock signal CK1. X half latches HB0–HBX carry out a latch operation in response to an applied clock signal CK2. Clock signals CK1 and CK2 alternately provide a clock signal of a width identical to that of clock signal CKA when subaddress signal WE0 shown in FIGS. 24 and 25 attains an H level. Half latches HA0–HAX and half latches HB0–HBX are connected in an alternate manner. Half latch HBX of the last stage is connected to half latch HA0 of the first stage, whereby a shift register is formed. Shift register 111a is initialized so that only two continuous half latches attain an H level. Therefore, the output signals of continuous half latches are sequentially shifted in which the state of an H level overlaps for only half a period.

Half latches HA0 and HB0 are connected to AND gate GA0. Half latches HB0 and HA1 are connected to AND gates GB0. Similarly, AND gates GA1–GAX, GB1–GBX are connected to a half latch. Therefore, the output signals of two continuous half latches are applied to one AND gate. AND gates GA0–GAX, GB0–GBX provide the logical product of the input signals as output signals SA0–SAX, SB0–SBX to row select line selection unit 13a.

Row select line selection unit 13a has a structure similar to row select line selection unit 13 of FIG. 20. The operation thereof is similar, and their description will not be repeated. There are W row select line selection circuits 131a–13Wa in row select line selection unit 13a. Corresponding to each row select line selection circuit, one AND gate and one half latch are provided in main address signal generation circuit 11a. Therefore, the total number of half latches HA0–HAX, HB0–HBX is W, which is half the number of the half latches included in main address signal generation circuit 11 of FIG. 20.

Figure 27:
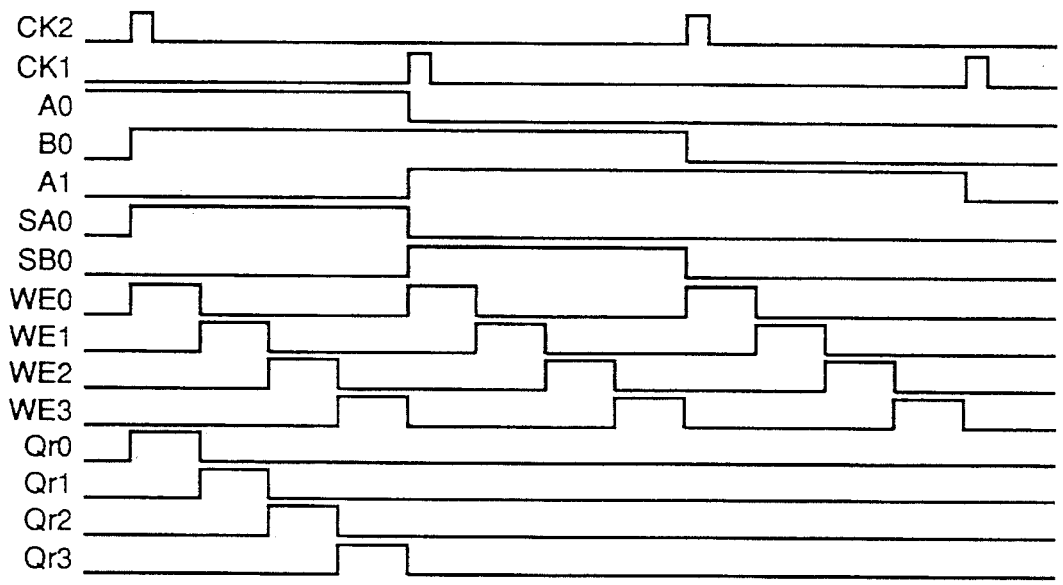
FIG. 27 is a timing chart for describing the operation of the main address signal generation circuit and the row select line selection unit of FIG. 26.

The operation of the main address signal generation circuit and the row select line selection unit of the above structure will be described. FIG. 27 is a timing chart for describing the operation of the main address signal generation circuit and the column select line selection unit of FIG. 26.

Referring FIGS. 26 and 27, shift register 111a is set so that any two continuous half latches attain an H level. Therefore, only two continuous signals attain an H level in output signals A0, B0, and A1. Therefore, by taking a logical product of these output signals from the half latches with an AND gate, only one output signal of the output signals of the AND gates attains an H level to result in, for example, output signals SA0, SB0. Thus, row select line selection unit 13a takes the logical products of each of signals SA0–SAX, SB0–SBX, respectively, output from main address signal generation circuit 11a and each of subaddress signals WE0–WE3 output from subaddress signal generation circuit, whereby one of row select signals Qr0–Qr3 is output at an H level. This state of an H level is sequentially shifted.

The reduction in the number of transistors employing the second specific example of the above-described subaddress signal generation circuit, main address signal generation circuit, and row select signal selection unit will be described hereinafter. When each circuit is formed as described above, the required number of transistors is shown in the following Table 3. In the example of Table 3, the number of transistors for 200 words is shown as in Tables 1 and 2. The numbers were obtained using the half latch shown in FIG. 21.

TABLE 3

| Circuit | Internal circuit | Number of circuits | Number of transistors per unit | Number of transistors with 200 words (W = 50) |
| --- | --- | --- | --- | --- |
| Subaddress signal generation circuit | Half latch | 2 | 10 | 80 |
| | Buffer circuit | 6 | 4 | 24 |
| Main address signal generation circuit | Half latch | W | 10 | 500 |
| Word line selection unit | NAND gate | 4 | 4 | 800 |
| | Buffer circuit | 2 | 2 | 400 |
| Total | | | | 1744 |

It is appreciated from the above Table 3 that the number of transistors used in the second example is reduced by approximately 30% in comparison with that of the first specific example shown in Table 2. Therefore, the area of the address pointer can further be reduced. It is therefore possible to reduce the area of the SAM.

When the half latch of FIG. 22 is used, the number of transistors in the above second specific example becomes 1484. Therefore, the number of transistor can further be reduced.

Although the second specific example was described with a structure divided into a main address signal generation circuit and a subaddress signal generation circuit, the number of half latches can also be reduced even when a row address pointer is formed using only the main address signal generation circuit shown in FIG. 26. Therefore, the area of the address pointer can also be reduced.

A third specific example of a subaddress signal generation circuit will be described hereinafter with reference to FIG.

28. In the third specific example, a subaddress signal is forced to an L level according to the state a row select line enable signal. For the sake of lowering power consumption in a readout operation in an SAM, a readout bit line is precharged with a precharge transistor. Then, the readout word line is rendered to an H level (selected state) to carry out a readout operation. Therefore, by forcing a subaddress signal to an L level in response to a row select line enable signal, the readout word line can be forced to an L level during a precharge period, so that the above-described readout operation can be carried out.

Figure 28:
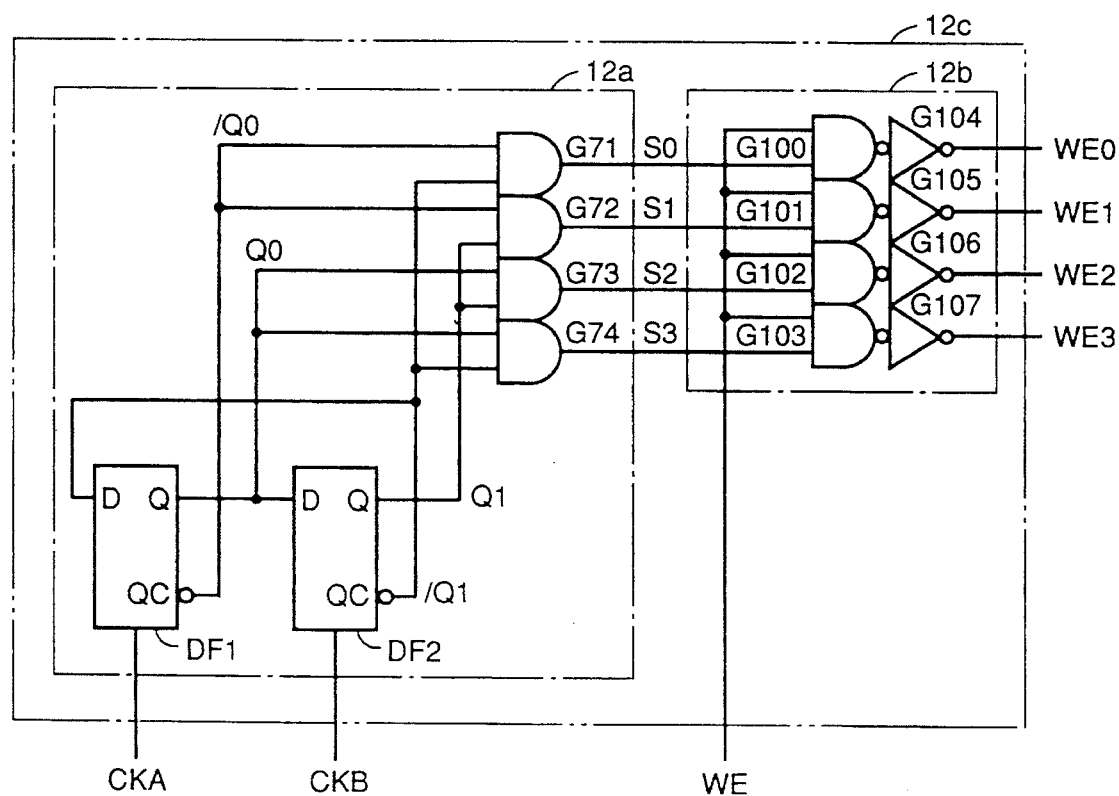
FIG. 28 shows a third specific structure of the subaddress signal generation circuit of FIG. 18.

Referring to FIG. 28, a subaddress signal generation circuit includes a subaddress signal generation circuit 12a and a control circuit 12b. Subaddress signal generation circuit 12a has a structure similar to that shown in FIG. 24. The operation thereof is also similar, so that their description will not be repeated.

Control circuit 12b includes NAND gates G100–G103, and inverters G104–G107. Output signals SO0–SO3 from subaddress signal generation circuit 12a are applied to each of NAND gates G100–G103. A row select line enable signal WE is applied to each of NAND gates G100–G103. NAND gates G100–G103 take the logical product of each input signal. An inverted signal thereof is provided to a corresponding inverters G104–G107. Inverters G104–G107 invert the applied signals to provide subaddress signals WE0–WE3.

According to the above structure, subaddress signals WE0–WE3 are output at an H level only when row select line enable signal WE attains an H level and output signals S0–S3 attain an H level.

Figure 29:
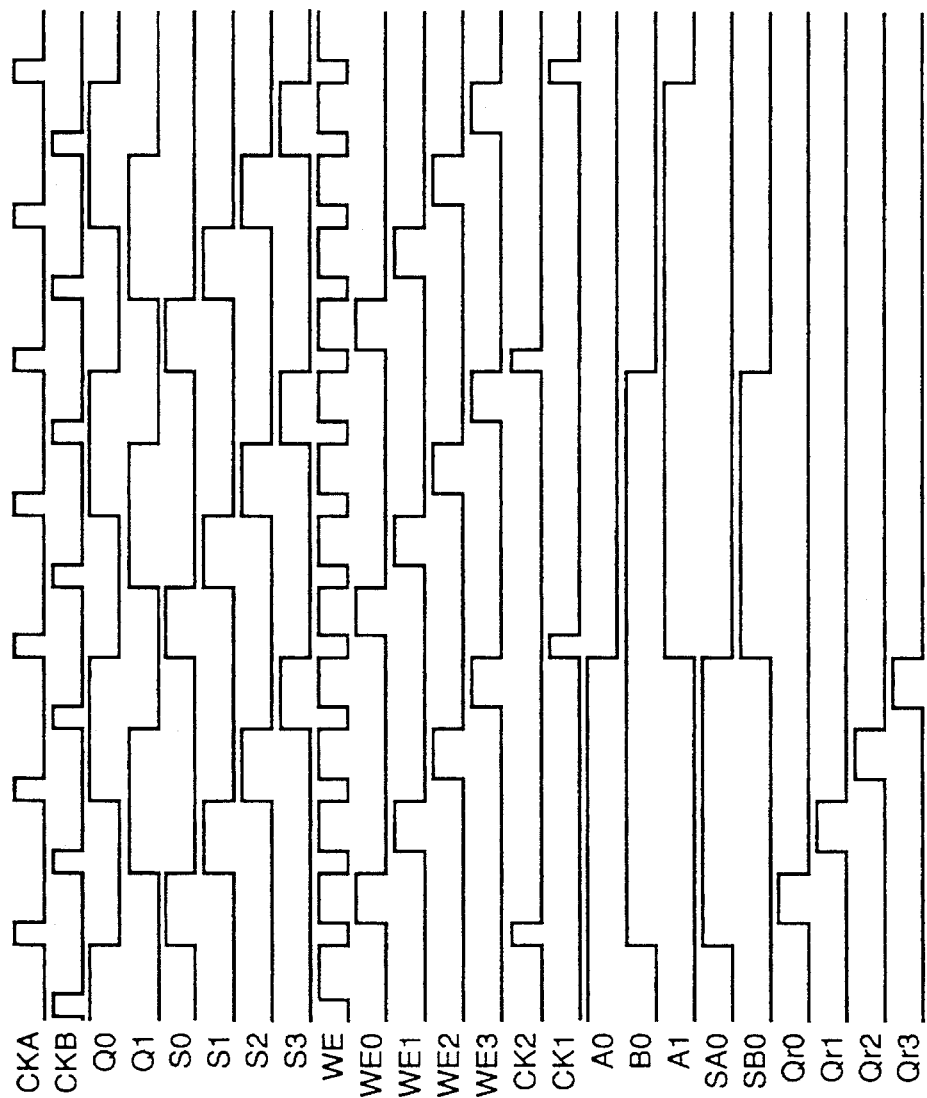
FIG. 29 is a timing chart for describing the operation of a row address pointer using the subaddress signal generation circuit of FIG. 28.

The operation of a row address pointer employing a subaddress signal generation circuit of the above structure will be described hereinafter. It is assumed that the circuits shown in FIG. 26 are employed for a main address signal generation circuit and a column select line selection unit. The same applies for the case where the circuit of FIG. 20 is employed. FIG. 29 is a timing chart for describing the operation of a row address pointer using the subaddress signal generation circuit of FIG. 28.

Referring to FIG. 29, clock signals CKA, CKB, output signals Q0, Q1 of a half latch, and output signals S0–S3 (corresponding to address signals WE0–WE3 in FIG. 25) are similar to the respective signals shown in FIG. 25, and their description will not be repeated. The logical products of output signals S0–S3 and row select line enable signal WE are taken. Output signals S0–S3 are forced to an L level when row select line enable signal WE attains an L level to be output as subaddress signals WE0–WE3. Similarly, clock signals CK2, CK1, output signals A0, B0, A1, and output signals SA0, SB0 operate in a manner similar to the respective signals of the timing chart of FIG. 27. Therefore, in response to subaddress signals WE0–WE3, row select signals Qr0–Qr3 are sequentially output attaining an H level. More specifically, row select signals Qr0–Qr3 are forced to an L level when row select line enable signal WE attains an L level. A readout bit line is precharged during this period to reduce power consumption.

Since control of row select line enable signal WE is carried out in a subaddress signal generation circuit, the used number of transistors can be reduced significantly in comparison with the case where each row select signal output from a row address pointer is controlled in response to a row select line enable signal WE. For example, when control of row select line enable signal WE is carried out for every row select signal, 800 transistors are required for 200 words. In contrast, the above-described embodiment requires only 16 transistors. It is therefore possible to control all the row select lines with an extremely small number of transistors.

The above third example was described for the case where a readout and write word line is used. When the word line is dedicated for readout and for writing, a dedicated readout address pointer and a write address pointer can be provided to operate in response to a write enable signal WE and a sense enable signal SE in order to achieve a similar effect.

In the above embodiment, it is assumed that a word line attains a selected state at an H level. This is because a memory cell is generally formed of an n channel transistor. When a memory cell is formed of a p channel transistor, a word line attains a selected state at an L level.

Although the structure of the main address signal generation circuit, subaddress signal generation circuit, and the row select line selection unit are described on the basis of an NAND gate, a similar structure can be obtained using an NOR gate.

The present invention is not limited to the above-described embodiment where a subaddress signal generation circuit generates four subaddress signals, and may be applied to the case where a different number of subaddress signals is used such as 2, 8, 16 subaddress signals. In this case, the effect of reducing the number of transistors becomes significant when there are more number of subaddress signals, i.e. more number of stages of a ring counter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sequential access memory storing y units of a data train of x words as one unit, comprising:

y memory cell arrays connected in series, each storing data of x words, and an address pointer for providing a plurality of select signals to sequentially access said data of x words to each of said y memory cell arrays, wherein each of said y memory cell arrays carries out data input and output for every x words in response to said select signals.

2. The sequential access memory according to claim 1, wherein each of said y memory cell arrays comprises a plurality of memory circuits for storing said data of x words, and a plurality of bit lines for transmitting data of a predetermined memory circuit out of said plurality of memory circuits, wherein said plurality of bit lines are arranged substantially in a linear manner in the longitudinal direction of said y memory cell arrays.

3. The sequential access memory according to claim 1, wherein each of said y memory cell arrays comprises a plurality of memory circuits arranged in a row direction and a column direction for storing said data of x words, said sequential access memory further comprising a plurality of select signal transmitting lines for transmitting a select signal out of said plurality of select signals to select said memory circuit in one of said row and column directions of said memory cell array, wherein said select signal transmitting lines are disposed in a substantially linear manner above said y memory cell arrays in the longitudinal direction.

4. The sequential access memory according to claim 3, wherein said select signal transmitting lines include a row select signal transmitting line for transmitting a row select signal to select said memory circuit in the row direction of said memory cell array.

5. The sequential access memory according to claim 3, wherein said select signal transmitting lines include a column select signal transmitting line for transmitting a column select signal to select said memory circuit in the column direction of said memory cell array.

6. The sequential access memory according to claim 1, wherein said address pointer comprises
   a row address pointer for providing a row select signal to select a predetermined row in said y memory cell arrays, and
   a column address pointer for providing a column select signal to select a predetermined column in said y memory cell arrays.

7. The sequential access memory according to claim 1, wherein each of said y memory cell arrays comprises
   a serial/parallel conversion circuit for converting input serial data into parallel data, and
   a plurality of word lines for selecting a memory circuit in the row direction out of said plurality of memory circuits,
   wherein said address pointer provides said select signal to a predetermined word line out of said plurality of word lines.

8. The sequential access memory according to claim 1, wherein each of said y memory cell arrays comprises a plurality of memory circuits for storing said data of x words,
   wherein said address pointer operates at a predetermined period,
   wherein each of said plurality of memory circuits comprises
   a write bit line for transmitting write data,
   first storage means for storing data transmitted by said write bit line,
   second storage means for storing data stored in said first storage means after one period of said address pointer, and
   a readout bit line for reading out data stored in said second storage means after one period of said address pointer.

9. The sequential access memory according to claim 8, wherein said first storage means comprises
   first and second word lines for controlling data writing and reading operations,
   a first capacitor for storing data input via said write bit line when said first word line is selected, and
   a bit line to which data stored in said first capacitor is read out when said second word line is selected,
   wherein said second storage means comprises
   a second capacitor for storing data read out to said bit line when said first word line is selected, and
   output means for providing data stored in said second capacitor to said readout bit line when said second word line is selected.

10. The sequential access memory according to claim 8, wherein said first storage means comprises
    first to third word lines for controlling data writing and readout operations,
    data holding means for holding data applied via said write bit line when said first word line is selected, and
    first output means for providing data stored in said data holding means to said second storage means when said second word line is selected,
    wherein said second storage means comprises
    a capacitor for holding data output from said first output means, and
    second output means for providing data held in said capacitor to said readout bit line when said third word line is selected.

11. The sequential access memory according to claim 8, wherein said first storage means comprises
    first to third word lines for controlling data writing and readout operations,
    a first capacitor for holding data input via said write bit line when said first word line is selected, and
    first inversion means for inverting data held in said first capacitor to provide said inverted data to said second storage means when said second word line is connected,
    wherein said second storage means comprises
    a second capacitor for holding data output from said first inversion means, and
    second inversion means for inverting data stored in said second capacitor to output said inverted signal to said readout bit line when said third word line is selected.

12. The sequential access memory according to claim 8, wherein said first storage means comprises
    first to third word lines for controlling data writing and readout operations,
    a first capacitor for holding data applied via said write bit line when said first word line is selected,
    first output means for providing data held in said first capacitor to said second storage means when said second word line is selected,
    wherein said second storage means comprises
    a second capacitor for holding data output from said first output means, and
    second output means for providing data held in said second capacitor to said readout bit line when said third word line is selected.

13. The sequential access memory according to claim 1, wherein each of said y memory cell arrays comprises a plurality of memory circuits for storing said data of x words, wherein each of said plurality of memory circuits comprises
    first and second write bit lines for transmitting write data,
    first storage means for storing data transmitted by said first write bit line,
    second storage means for storing data transmitted by said second write bit line, and
    a commonly-shared readout bit line for transmitting data stored in said first and second storage means.

14. The sequential access memory according to claim 1, wherein said address pointer comprises
    first select means for providing a first select signal,
    second select means for providing a second select signal,
    third select means for providing said plurality of select signals in response to said first and second select signals, and
    control means provided in at least one of said first and second select means for controlling output operation of one of said first and second select means in response to an externally applied control signal.

15. The sequential access memory according to claim 14, wherein each of said y memory cell arrays comprises
    a plurality of memory circuits arranged in a row direction and a column direction, a plurality of word lines for selecting a predetermined memory circuit out of said plurality of memory circuits, wherein said plurality of select signals comprise a signal for selecting a predetermined word line out of said plurality of word lines.

16. The sequential access memory according to claim 1, wherein said address pointer comprises k first latch means for latching an input signal in response to a first clock signal, and k second latch means for latching an output signal of said first latch means in response to a second clock signal differing in phase from said first clock signal, wherein said first and second latch means are connected alternately in a ring manner, wherein said address pointer further comprises 2k logic processing means for providing as said plurality of select signals the logical products of an output signal of said first latch means and an output signal of said second latch means connected to said first latch means.

17. The sequential access memory according to claim 16, wherein said address pointer further comprises subselect means for selecting a subselect signal, and select means for providing said plurality of select signals in response to an output signal of said 2k logic processing means and said subselect signal.

18. The sequential access memory according to claim 17, wherein said subselect signal comprises first to fourth subselect signals, wherein said subselect means comprises third latch means for latching an input signal in response to a third clocks signal, fourth latch means for latching an output signal of said third latch means in response to a fourth clock signal differing in phase from said third clock signal, and providing an inverted signal thereof to said third latch means, first logic processing means for providing a logical product of an inverted signal of an output signal of said third latch means and an inverted signal of an output signal of said fourth latch means as said first subselect signal, second logic processing means for providing a logic product of an inverted signal of an output signal of said third latch means and an output signal of said fourth latch means as said second subselect signal, third logic processing means for providing a logical product of an output signal of said third latch means and an output signal of said fourth latch means as said third subselect signal, and fourth logic processing means for providing a logical product of an output signal of said third latch means and an inverted signal of an output signal of said fourth latch means as said fourth subselect signal.

19. A sequential access memory for accessing data sequentially using an address pointer that operates at a predetermined period, comprising:

a write bit line for transmitting write data, first storage means for storing data transmitted by said write bit line, second storage means for storing data stored in said first storage means after one period of said address pointer, and a readout bit line for reading out data stored in said second storage means after one period of said address pointer.

20. The sequential access memory according to claim 19, wherein said first storage means comprises first and second word lines for controlling data writing and readout operations, a first capacitor for holding data applied via said write bit line when said first word line is selected, a bit line to which data held in said first capacitor is read out when said second word line is selected, wherein said second storage means comprises a second capacitor for holding data read out to said bit line when said first word line is selected, and output means for providing data held in said second capacitor to said readout bit line when said second word line is selected.

21. The sequential access memory according to claim 19, wherein said first storage means comprises first to third word lines for controlling data writing and readout operations, data holding means for holding data applied via said write bit line when said first word line is selected, first output means for providing data stored in said data holding means to said second storage means when said second word line is selected, wherein said second storage means comprises a capacitor for holding data output from said first output means, and second output means for providing data held in said capacitor to said readout bit line when said third word line is selected.

22. The sequential access memory according to claim 19, wherein said first storage means comprises first to third word lines for controlling data writing and readout operations, a first capacitor for holding data applied via said write bit line when said first word line is selected, first inversion means for inverting data held in said first capacitor to output said inverted data to said second storage means when said second word line is selected, wherein said second storage means comprises a second capacitor for holding data output from said first inversion means, and second inversion means for inverting data held in said second capacitor to output said inverted data to said readout bit line when said third word line is selected.

23. The sequential access memory according to claim 19, wherein said first storage means comprises first to third word lines for controlling data writing and readout operations, a first capacitor for holding data applied via said write bit line when said first word line is selected, and first output means for providing data held in said first capacitor to said second storage means when said second word line is selected, wherein said second storage means comprises a second capacitor for holding data output from said first output means, and second output means for providing data held in said second capacitor to said readout bit line when said third word line is selected.

24. A sequential access memory comprising:

first and second write bit lines for transmitting write data, first storage means for storing data transmitted by said first write bit line, second storage means for storing data transmitted by said second write bit line, and a commonly-shared readout bit line for transmitting data stored in said first and second storage means.

25. The sequential access memory for sequentially selecting a predetermined select line out of a plurality of select lines, comprising:

first select means for providing a first select signal to select said select lines, second select means for providing a second select signal to select said select lines, third select means for providing a third select signal to select a predetermined select line out of said plurality of select lines according to said first and second select signals, and control means provided at least in one of said first and second select means for controlling output operation of one of said first and second select means according to an externally applied control signal.

26. The sequential access memory according to claim 25, further comprising:

a memory cell array including a plurality of memory circuits arranged in a row direction and a column direction, wherein said select line comprises a word line for selecting a predetermined memory circuit from said memory cell array.

27. A sequential access memory for selecting a predetermined select line out of a plurality of select lines to select a predetermined memory circuit in response to a select signal, said sequential access memory comprising:

k first latch means for latching an input signal in response to a first clock signal, k second latch means for latching an output signal of said first latch means in response to a second clock signal differing in phase from said first clock signal, wherein said first and second latch means are connected alternately in a ring manner, said sequential access memory further comprising 2k logic processing means for providing a logical product of an output signal of said first latch means and an output signal of said second latch means connected to said first latch means as said select signal.

28. The sequential access memory according to claim 27, further comprising:

subselect means for providing a subselect signal to select said select line, and select line selection means for providing a select line select signal to select a predetermined select line from said plurality of select lines in response to said select signal and said subselect signal.

29. The sequential access memory according to claim 28, wherein said subselect means comprises first to fourth subselect signals, wherein said subselect means comprises third latch means for latching an input signal in response to a third clock signal, fourth latch means for latching an output signal of said third latch means in response to a fourth clock signal differing in phase from said third clock signal, and providing an inverted signal thereof to said third latch means, first logic processing means for providing a logical product of an inverted signal of an output signal of said third latch means and an inverted signal of an output signal of said fourth latch means as said first subselect signal, a second logic processing means for providing a logical product of an inverted signal of an output signal of said third latch means and an output signal of said fourth latch means as said second subselect signal, third logic processing means for providing a logical product of an output signal of said third latch means and an output signal of said fourth latch means as said third subselect signal, and fourth logic processing means for providing a logical product of an output signal of said third latch means and an inverted signal of an output signal of said fourth latch means as said fourth subselect signal.

* * * * *